(12) United States Patent
Choi et al.

(10) Patent No.: US 8,299,702 B2
(45) Date of Patent: Oct. 30, 2012

(54) LUMINESCENCE DISPLAY PANEL WITH AUXILIARY ELECTRODE AND METHOD FOR FABRICATING THE SAME

(75) Inventors: Ho Won Choi, Gumi-si (KR); Jae Hee Park, Gumi-si (KR)

(73) Assignee: LG Display Co., Ltd., Seoul (KR)

( * ) Notice: Subject to any disclaimer, the term of this patent is extended or adjusted under 35 U.S.C. 154(b) by 331 days.

(21) Appl. No.: 12/272,582

(22) Filed: Nov. 17, 2008

(65) Prior Publication Data
US 2009/0315458 A1 Dec. 24, 2009

(30) Foreign Application Priority Data

Jun. 24, 2008 (KR) .................. 10-2008-0059890
Aug. 13, 2008 (KR) .................. 10-2008-0079218
Sep. 30, 2008 (KR) .................. 10-2008-0095845

(51) Int. Cl.
*H01J 1/62* (2006.01)
*H01J 63/04* (2006.01)

(52) U.S. Cl. ........ 313/503; 313/498; 313/504; 313/506; 313/512

(58) Field of Classification Search ............ 313/498–512
See application file for complete search history.

(56) References Cited

U.S. PATENT DOCUMENTS

| | | | | |
|---|---|---|---|---|
| 2005/0001546 A1* | 1/2005 | Yamaguchi | .................. | 313/512 |
| 2005/0077816 A1* | 4/2005 | Yamada et al. | .............. | 313/503 |
| 2005/0093439 A1* | 5/2005 | Harada et al. | ................ | 313/506 |
| 2005/0189857 A1* | 9/2005 | Kobori | ........................ | 313/110 |
| 2006/0158095 A1  | 7/2006 | Imamura | | |
| 2007/0018572 A1  | 1/2007 | Fukunaga | | |
| 2007/0063645 A1* | 3/2007 | Yokoyama | .................... | 313/506 |
| 2007/0108899 A1  | 5/2007 | Jung et al. | | |
| 2007/0176548 A1* | 8/2007 | Kim et al. | .................... | 313/512 |
| 2007/0176553 A1* | 8/2007 | Kwak | ........................ | 313/512 |
| 2008/0157654 A1* | 7/2008 | Cok | ............................ | 313/504 |
| 2009/0058294 A1* | 3/2009 | Joo et al. | ...................... | 313/512 |
| 2009/0200936 A1* | 8/2009 | Kang et al. | ................... | 313/505 |

FOREIGN PATENT DOCUMENTS

CN 1822738 A 8/2006

* cited by examiner

*Primary Examiner* — Anh Mai
*Assistant Examiner* — Kevin Quaterman
(74) *Attorney, Agent, or Firm* — Birch, Stewart, Kolasch & Birch, LLP

(57) ABSTRACT

A luminescence display panel, which can be manufactured without any damage to an organic layer thereof, and a method for fabricating the same are disclosed. According to one of the embodiments in the present invention, the luminescence display panel includes a first electrode formed on a lower substrate, an organic layer formed on the first electrode, the organic layer including a luminescence layer, a second electrode formed on the organic layer, the second electrode having a thin film structure, and an auxiliary electrode formed on an upper substrate and facing the lower substrate, the auxiliary electrode being connected to the second electrode. The second electrode is thinner than at least one of the first electrode and the auxiliary electrode.

14 Claims, 27 Drawing Sheets

LUMINESCENCE DISPLAY PANEL WITH AUXILIARY ELECTRODE AND METHOD FOR FABRICATING THE SAME

This application claims the benefit of the Korean Patent Application No. 10-2008-059890, filed on Jun. 24, 2008, Korean Patent Application No. 10-2008-079218, filed on Aug. 13, 2008, and Korean Patent Application No. 10-2008-095845, filed on Sep. 30, 2008, which are hereby incorporated by reference as if fully set forth herein.

BACKGROUND OF THE INVENTION

1. Field of the Invention

The present invention relates to a luminescence display panel, which can be manufactured without any damage to an organic layer thereof, and a method for fabricating the same.

2. Discussion of the Related Art

Image display devices, which render various information on a screen, are used as an important technique in the current information communication age. Such image display devices are being advanced toward thinness, lightness, portability, and high performance. Currently, an organic light emitting diode (OLED), which displays an image by controlling the amount of light emitted from an organic luminescence layer, is being highlighted as a flat panel display device capable of reducing the drawback of cathode ray tubes (CRTs), namely, a heavy and bulky structure. The OLED has an advantage in that it can have a thin film structure such as paper because it is a self-luminescence device using a thin luminescence layer arranged between electrodes. Thus, due to the OLED's self-luminescence characteristic, OLED does not require a backlight unit to provide a light source, unlike liquid crystal devices that are conventionally used as displace devices. In the case of an active matrix OLED (AMOLED), pixels each consisting of three-color (R, G, and B) sub pixels are arranged in the form of a matrix, to display an image. Each sub-pixel includes an organic electro-luminescence (OEL) cell, and a cell driver for independently driving the OEL cell. The OEL cell includes a first electrode connected to the cell driver, an organic layer formed on the first electrode, and a second electrode formed on the organic layer.

The cell driver includes at least two thin film transistors and a storage capacitor, which are connected among a gate line for supplying a scan signal, a data line for supplying a video data signal, and a common power line for supplying a common power signal. In accordance with this configuration, the cell driver drives the OEL cell.

In the related art cases, the second electrode of the OEL cell is deposited in accordance with a sputtering method. For this reason, the organic layer arranged beneath the second electrode may be damaged. The damaged organic layer exhibits degradation in luminescence efficiency. As a result, degradation in picture quality such as a black point or a dark spot may be generated in an area where an image is rendered through the damaged organic layer.

Due to the possibility of the damage to the organic layer, it is also difficult to deposit the second electrode, which is formed on the organic layer, at high temperature.

SUMMARY OF THE INVENTION

Accordingly, the present invention is directed to a luminescence display panel and a method for fabricating the same that substantially obviate one or more problems due to limitations and disadvantages of the related art.

An object of the present invention is to provide a luminescence display panel, which can be manufactured without any damage to an organic layer thereof, and a method for fabricating the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a luminescence display panel comprises: a first electrode formed on a lower substrate; an organic layer formed on the first electrode, the organic layer including a luminescence layer; a second electrode formed on the organic layer, the second electrode having a thin film structure; and an auxiliary electrode formed on an upper substrate and facing the lower substrate, the auxiliary electrode being connected to the second electrode, wherein the second electrode is thinner than at least one of the first electrode and the auxiliary electrode.

In another aspect of the present invention, a method for fabricating a luminescence display panel comprises: forming a first electrode a lower substrate; forming an organic layer on the first electrode, the organic layer including a luminescence layer; forming a second electrode on the organic layer, the second electrode having a thin film structure; forming an auxiliary electrode on an upper substrate, the auxiliary electrode facing the lower substrate; and assembling the upper and lower substrates such that the second electrode contacts the auxiliary electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and along with the description serve to explain the principle of the invention. In the drawings.

DETAILED DESCRIPTION OF THE INVENTION

Reference will now be made in detail to the preferred embodiments of the present invention associated with a luminescence display panel and a method for fabricating the same, examples of which are illustrated in the accompanying drawings.

Figure 1:
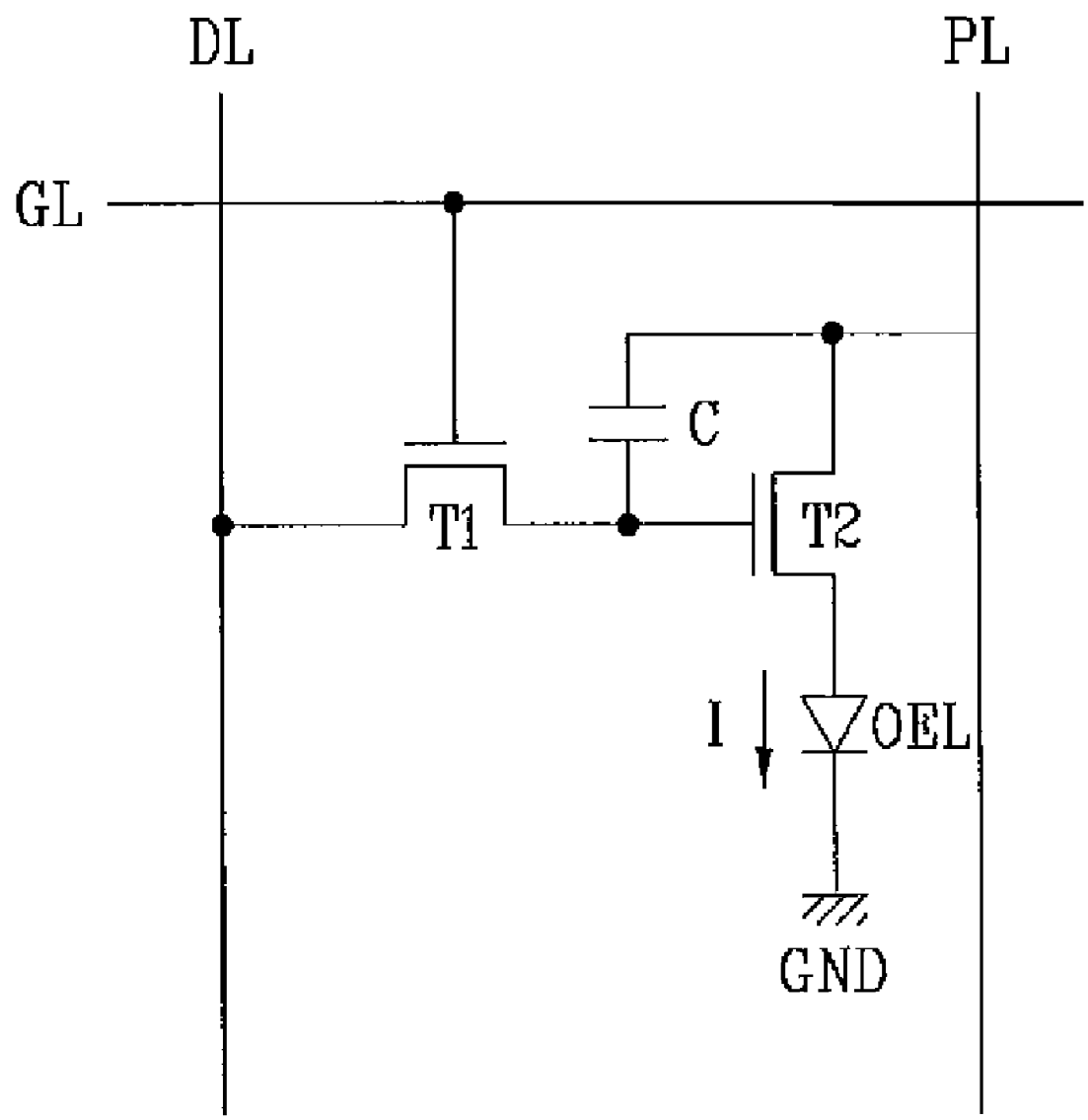
FIG. 1 is an equivalent circuit diagram of one pixel of a luminescence display panel according to the present invention.

FIG. 1 is an equivalent circuit diagram of one pixel of a luminescence display panel according to the present invention. As shown in FIG. 1, each pixel of the luminescence display panel shown in FIG. 1 includes a switch thin film transistor (TFT) T1 connected to a gate line GL and a data line DL, a drive TFT T2 connected to the switch TFT T1 while being connected to a power line PL and an organic electroluminescence (OEL) cell, and a storage capacitor C connected to the power line PL and the drain electrode of the switch TFT T1. The OEL cell, which is connected with the drive TFT T2 is also included in the pixel.

The gate electrode of the switch TFT T1 is connected to the gate line GL. The source electrode of the switch TFT T1 is connected to the data line DL. The drain electrode of the switch TFT T1 is connected to the gate electrode of the drive TFT T2 and the storage capacitor C. The source electrode of the drive TFT T2 is connected to the power line PL. The drain electrode of the drive TFT T2 is connected to one of the electrodes of the OEL cell. The storage capacitor C is connected between the power line PL and the gate electrode of the drive TFT T2.

When a scan pulse is supplied to the gate line GL, the switch TFT T1 is turned on, to send a data signal, which is supplied to the data line DL, to the storage capacitor C and the gate electrode of the drive TFT T2. In response to the data signal supplied to the gate electrode thereof, the drive TFT T2 controls current I supplied from the power line PL to the OEL cell, to adjust the amount of light emitted from the OEL cell. Even when the switch TFT T1 turns off, the drive TFT T2 supplies a constant amount of current I until a data signal corresponding to a next frame is supplied, thereby causing the OEL cell to continuously emit light.

Figure 2:
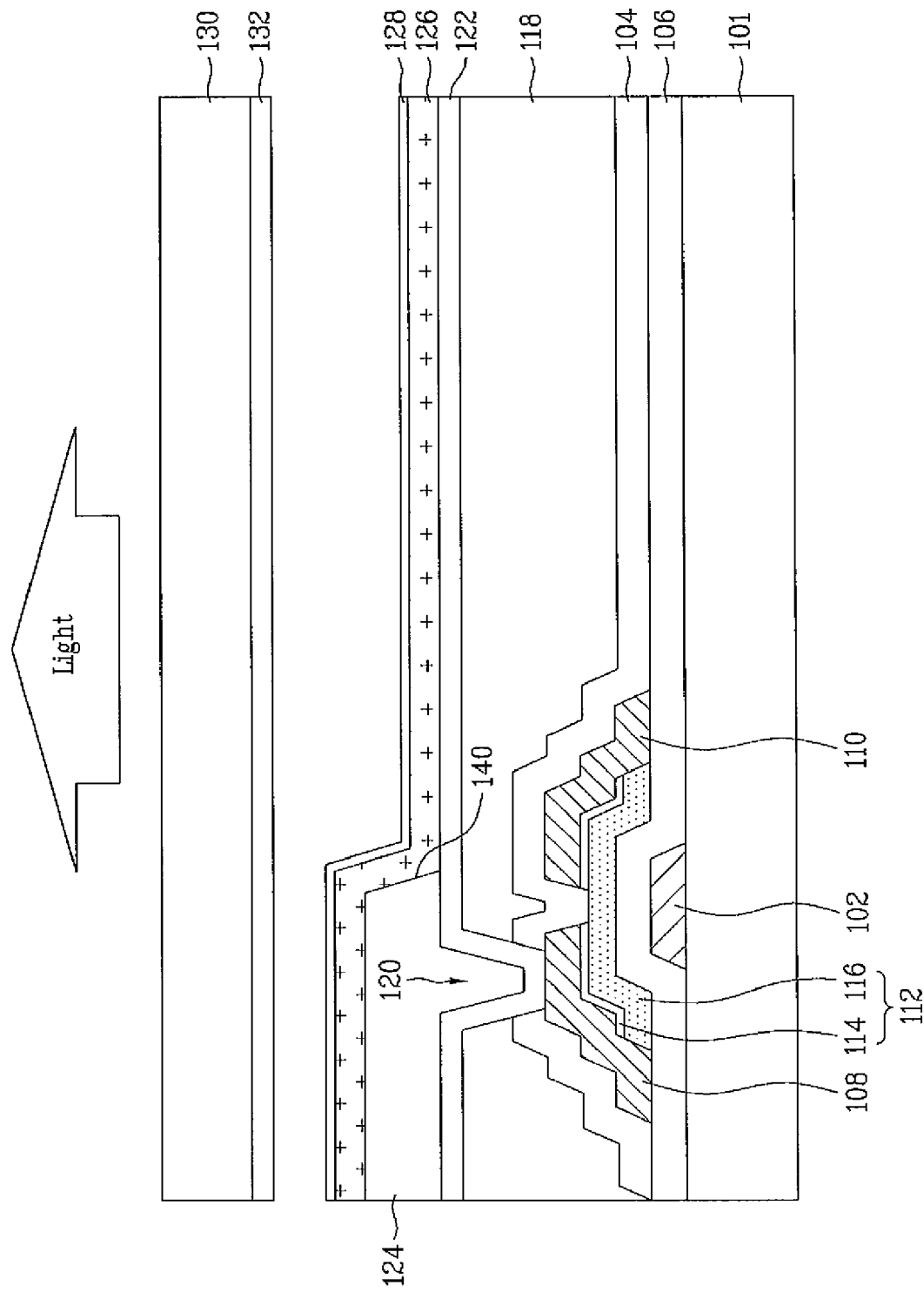
FIG. 2 is a sectional view illustrating a luminescence display panel according to a first embodiment of the present invention.

As shown in FIG. 2, the drive TFT T2 includes a gate electrode 102 formed on a lower substrate 101, a gate insulating film 106 covering the gate electrode 102, an active layer 116 formed on the gate insulating film 106 such that the active layer 116 overlaps with the gate electrode 102, to form a channel, an ohmic contact layer 114 formed on the active layer 116 except in a region for the channel, to form ohmic contacts with the source electrode 110 and drain electrode 108, and source and drain electrodes 110 and 108 arranged to face each other at opposite sides of the channel. An inorganic passivation film 104 made of an inorganic insulating material and an organic passivation film 118 made of an organic insulating material may also be formed on the drive TFT T2, which is formed on the lower substrate 101.

The OEL cell includes a first electrode 122 formed on the organic passivation film 118 covering the drive TFT T2, a bank insulating film 124 formed with an organic hole 140, through which the first electrode 122 is partially exposed, an organic layer 126 including a luminescence layer formed on the portion of the first electrode 122 exposed through the organic hole 140, a second electrode 128 formed on the organic layer 126, and an auxiliary electrode 132 formed on an upper substrate 130.

The first electrode 122, which functions as a cathode, is made of an opaque conductive material such as aluminum (Al).

Figure 3:
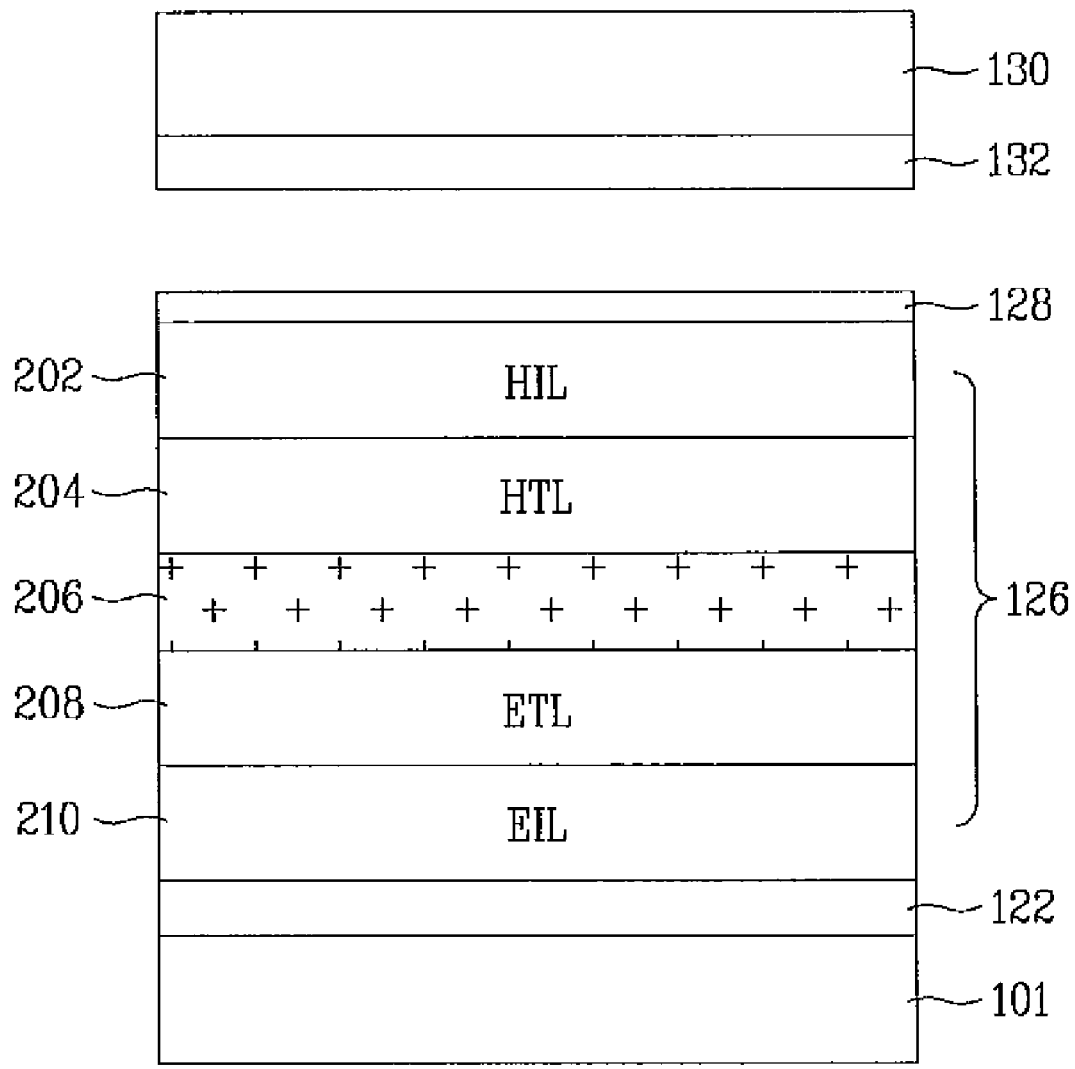
FIG. 3 is a sectional view for concretely explaining an organic layer included in the luminescence display panel shown in FIG. 2.

As shown in FIG. 3, the organic layer 126 is formed by sequentially forming, on the first electrode 122, an electron injection layer (ETL) 210, an electron transport layer (ETL) 208, a luminescence layer 206, a hole transport layer (HTL) 204, and a hole injection layer (HIL) 202. The luminescence layer 206 emits light of a particular wavelength from the upper surface thereof toward the upper substrate 130 as exciters generated in accordance with re-coupling of electrons from the first electrode 122 and holes from the auxiliary electrode 132 and second electrode 128 return to a ground state.

The second electrode 128 is formed on the organic layer 126 in the form of a thin film. The second electrode 128 may have a structure having at least one layer using a transparent conductive material such as a transparent conductive oxide (TCO) or an opaque conductive material, or may have a multilayer structure using a combination of such materials. The second electrode 128 may be formed using a thermal deposition method, a sputtering method, or a combination thereof, in order to prevent the organic layer 126 from being adversely influenced. Even when the second electrode 128 is deposited on the organic layer 126, using a sputtering method, there is no or little damage to the organic layer 126 because the second electrode is formed in the form of a thin film having no adverse influence on the organic layer 126. Where the second electrode 128 is formed using an opaque conductive material, it is formed in the form of a thin film capable of allowing light emitted from the organic layer 126 to pass therethrough. The second electrode 128 is thinner than one of or both of the first electrode 122 and auxiliary electrode 132. Preferably, second electrode 128 has a thickness of about 10 to 500 Å.

The auxiliary electrode 132 is formed on the upper substrate 130 such that it is connected with the second electrode 128 formed on the organic layer 126. The auxiliary electrode 132 is formed to have a structure having at least one layer, preferably using a TCO material such as indium tin oxide (ITO) or indium zinc oxide (IZO). Alternatively, the auxiliary electrode 132 may be formed on the upper substrate 130, using a transparent conductive material and a metal layer having a thin film structure, in order to have a multilayer structure. The metal layer included in the auxiliary electrode 132 has a thickness capable of allowing light to pass therethrough, namely, a thickness of about 10 to 500 Å.

Where the auxiliary electrode 132 is formed to have at least two layers, it is possible to reduce the contact resistance of the auxiliary electrode 132 generated when the auxiliary electrode 132 comes into contact with the second electrode 128.

Figure 4:
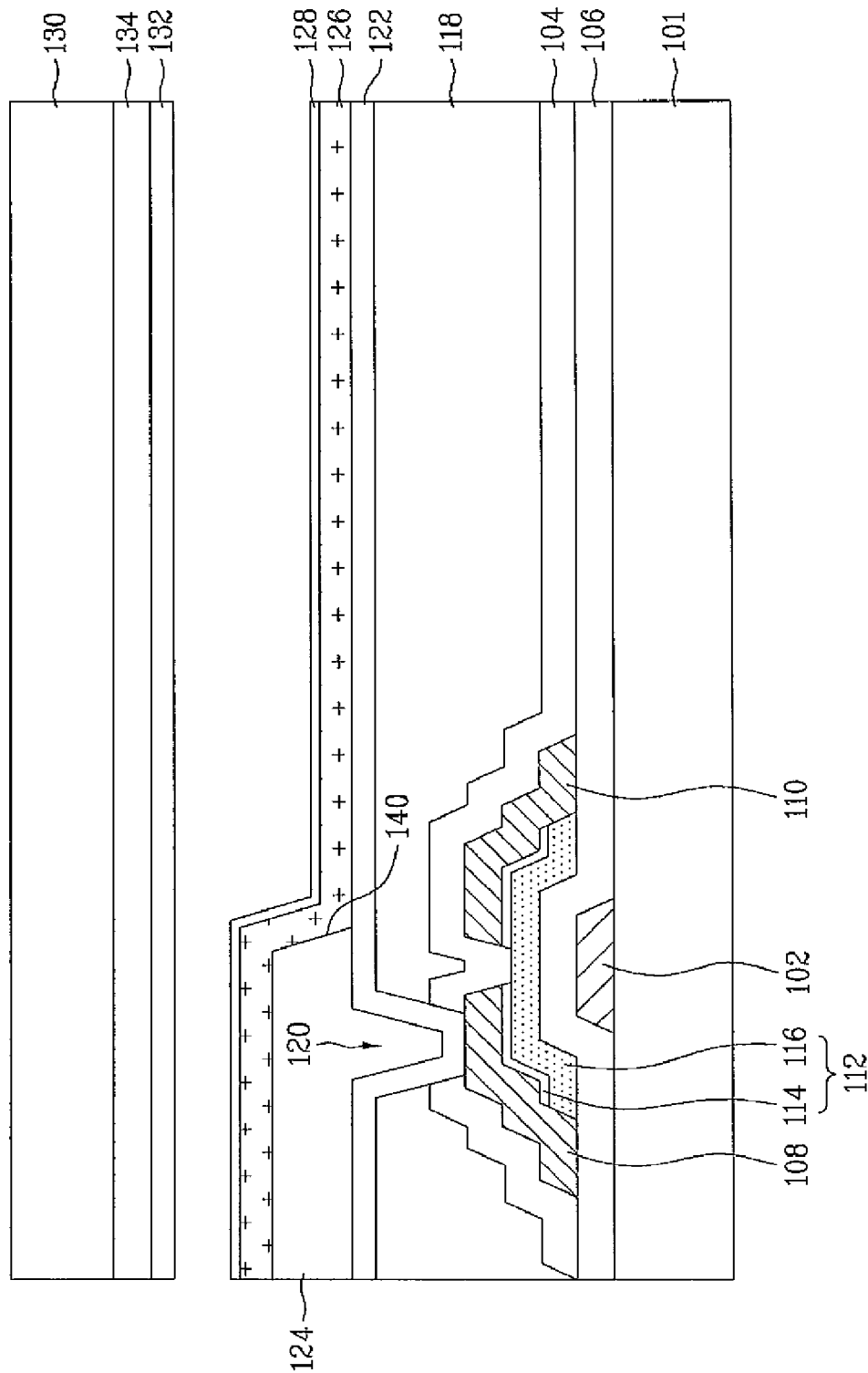
FIG. 4 is a sectional view illustrating another embodiment associated with a second electrode shown in FIG. 2.
Figure 5:
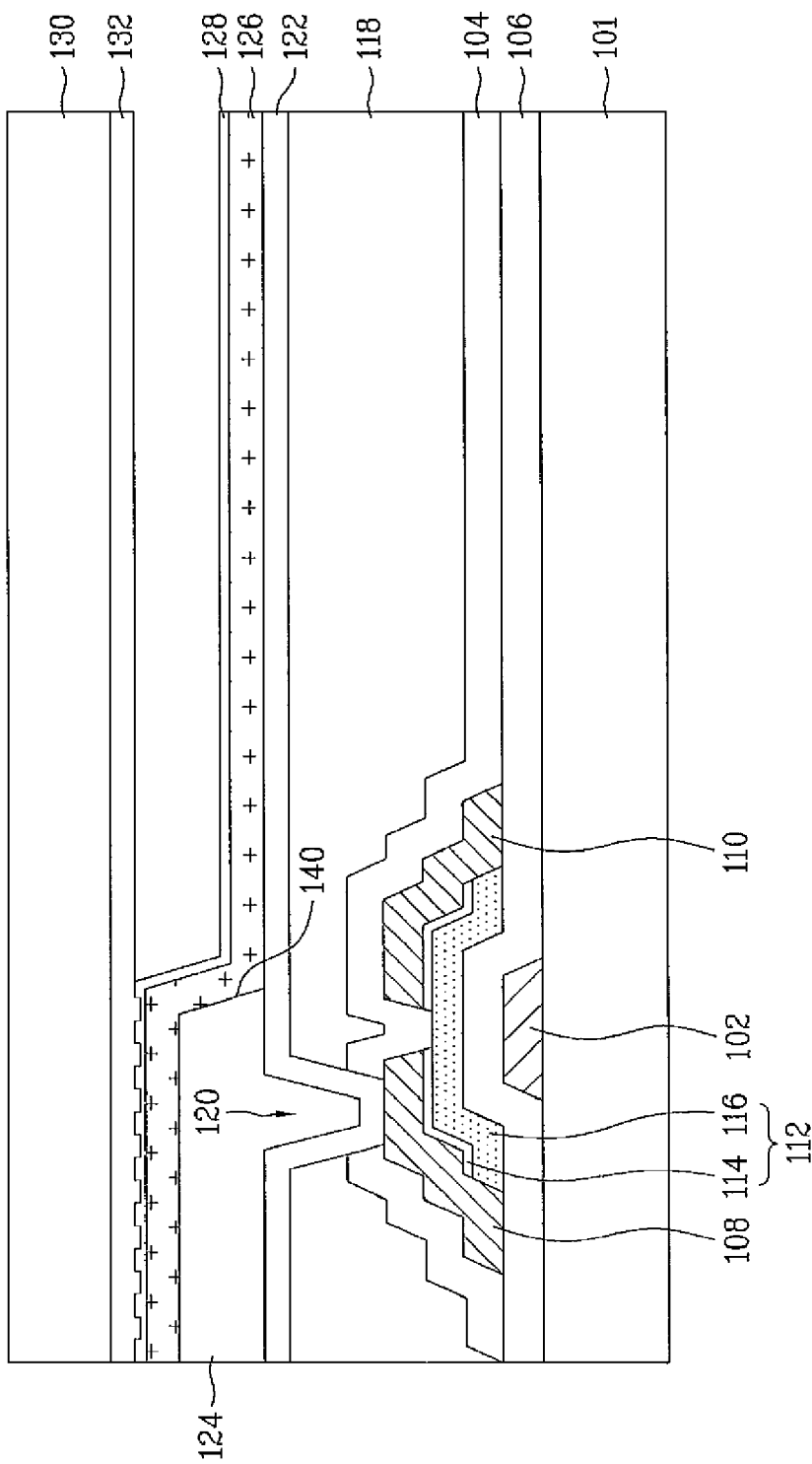
FIG. 5 is a sectional view illustrating another embodiment associated with the second electrode shown in FIG. 2.

The auxiliary electrode 132 may be directly formed on the upper substrate 130. Alternatively, an upper passivation film 134 may be formed between the upper substrate 130 and the auxiliary electrode 132, as shown in FIG. 4. Further, the auxiliary electrode 132 and the second electrode 128, which are in contact with each other, may be subjected, at interfaces thereof, to a surface treatment using plasma or ultraviolet (UV) rays, so that the auxiliary electrode 132 and the second electrode 128, which comes into contact with the auxiliary electrode 132, may have an embossing structure, as shown in FIG. 5. The embossing structures of the auxiliary electrode 132 and the second electrode 128 may be formed to interlock each other. The grooves of the auxiliary electrode 132 come into contact with the protrusions of the second electrode 128. The protrusions of the auxiliary electrode 132 come into contact with the grooves of the second electrode 128. As a result, the contact area between the auxiliary electrode 132 and the second electrode 128 increases, thereby achieving a decrease in the contact resistance between the auxiliary electrode 132 and the second electrode 128 and an enhancement in the bonding force between the auxiliary electrode 132 and the second electrode 128 when the upper and lower substrates 130 and 101 are vacuum-assembled. Also, the work function of the auxiliary electrode 132 increases in accordance with the surface treatment, thereby achieving an enhancement in electrical characteristics.

Figure 6A:
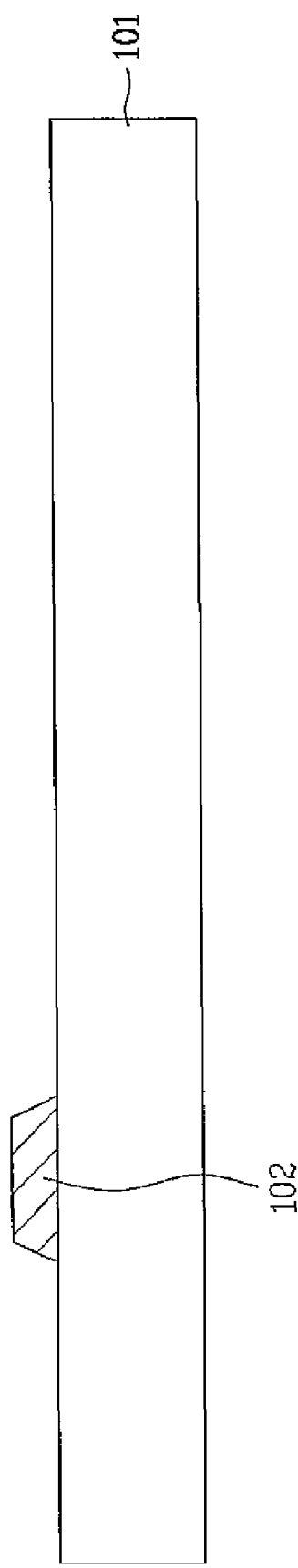
FIGS. 6A to 6H are sectional views for explaining a method for fabricating a luminescence display panel according to a first embodiment of the present invention.

FIGS. 6A to 6H are sectional views for explaining a method for fabricating a luminescence display panel according to a first embodiment of the present invention. Referring to FIG. 6A, a gate metal pattern, which includes a gate electrode 102 and a gate line, is formed on a lower substrate 101. In detail, a gate metal layer is deposited over the lower substrate 101 in accordance with a deposition method such as a sputtering method. The gate metal layer may be made of aluminum (Al), aluminum alloy, aluminum-neodymium (AlNd), copper (Cu), titanium (Ti), or chromium (Cr). However, the gate metal layer may be made of other materials, which are not limited to the above. The gate metal layer is patterned in accordance with a photolithography process and an etching process, to form the gate metal pattern, which includes the gate line and the gate electrode 102.

Figure 6B:
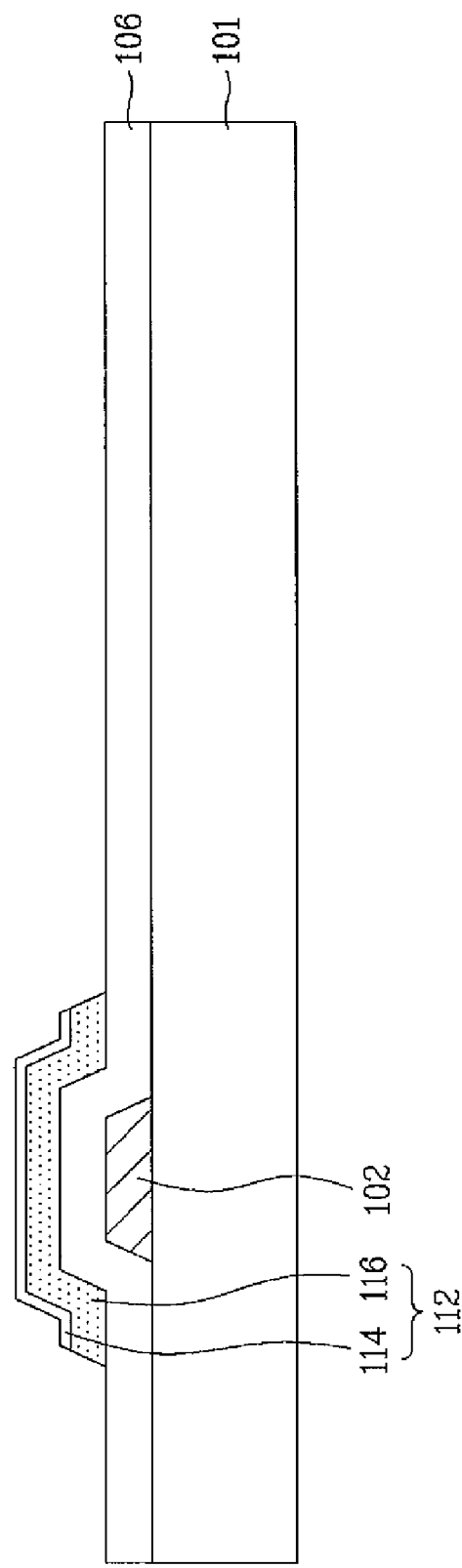

Referring to FIG. 6B, a gate insulating film 106 is formed over the lower substrate 101 formed with the gate metal pattern. A semiconductor pattern 112, which includes an active layer 116 and an ohmic contact layer 114, is formed on the gate insulating film 106. In detail, an inorganic insulating material is deposited over the entire upper surface of the lower substrate 101 formed with the gate metal pattern, in accordance with a deposition method such as a plasma enhanced chemical vapor deposition (PECVD) method, to form the gate insulating film 106. Thereafter, an amorphous silicon layer and an impurity-doped amorphous silicon layer are sequentially formed in accordance with the deposition method that is preferably the same deposition method as that of the gate insulating film. Subsequently, the amorphous silicon layer and the impurity-doped amorphous silicon layer are patterned in accordance with a photolithography process and an etching process, to form the semiconductor pattern 112 including the active layer 116 and ohmic contact layer 114. The gate insulating film 106 is made of an inorganic insulating material such as a silicon nitride ($SiN_x$) or a silicon oxide ($SiO_x$).

Figure 6C:
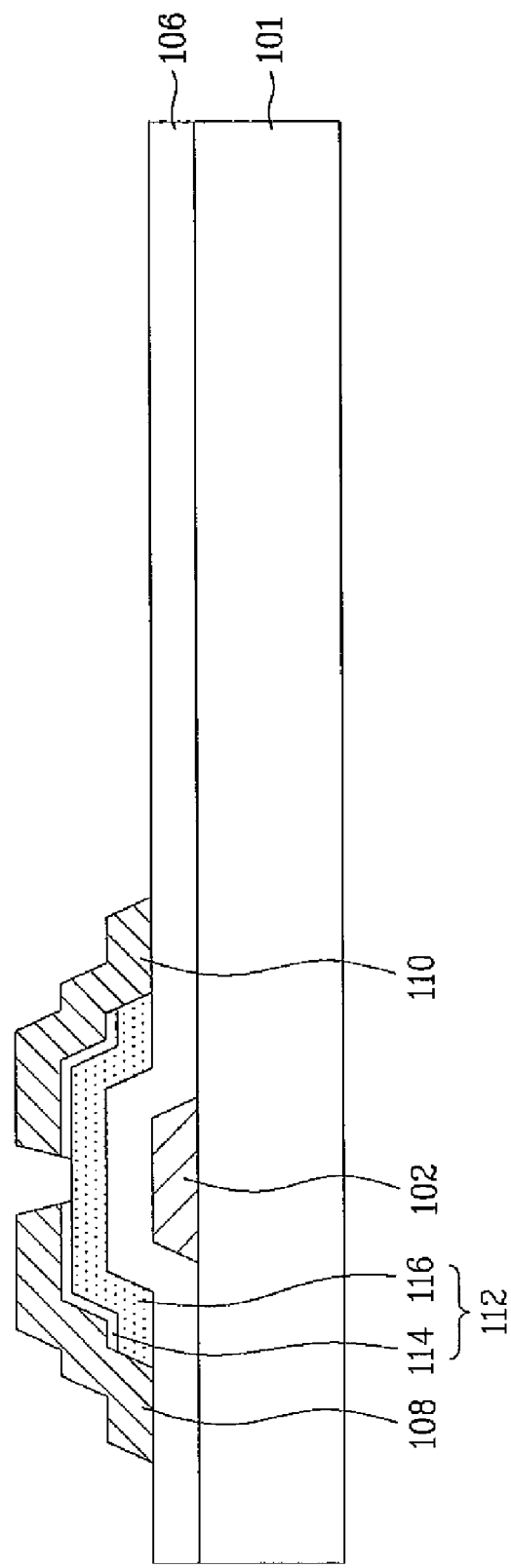

Referring to FIG. 6C, a source/drain electrode pattern, which includes a source electrode 110 and a drain electrode 108, is formed on the gate insulating film 106 formed with the semiconductor pattern 112. In detail, a source/drain metal layer is formed over the gate insulating film 106 formed with the semiconductor pattern 112, in accordance with a deposition method such as a sputtering method. Preferably, the source/drain metal layer is made of molybdenum (Mo), molybdenum-tungsten (MoW), or copper (Cu). The source/drain metal layer is patterned in accordance with a photolithography process and an etching process, to form the source/drain electrode pattern including the source electrode 110 and drain electrode 108. Using the source electrode 110 and drain electrode 108 as a mask, the ohmic contact layer 114, which is exposed between the two electrodes 110 and 108, is partially removed, to expose the active layer 116.

Figure 6D:
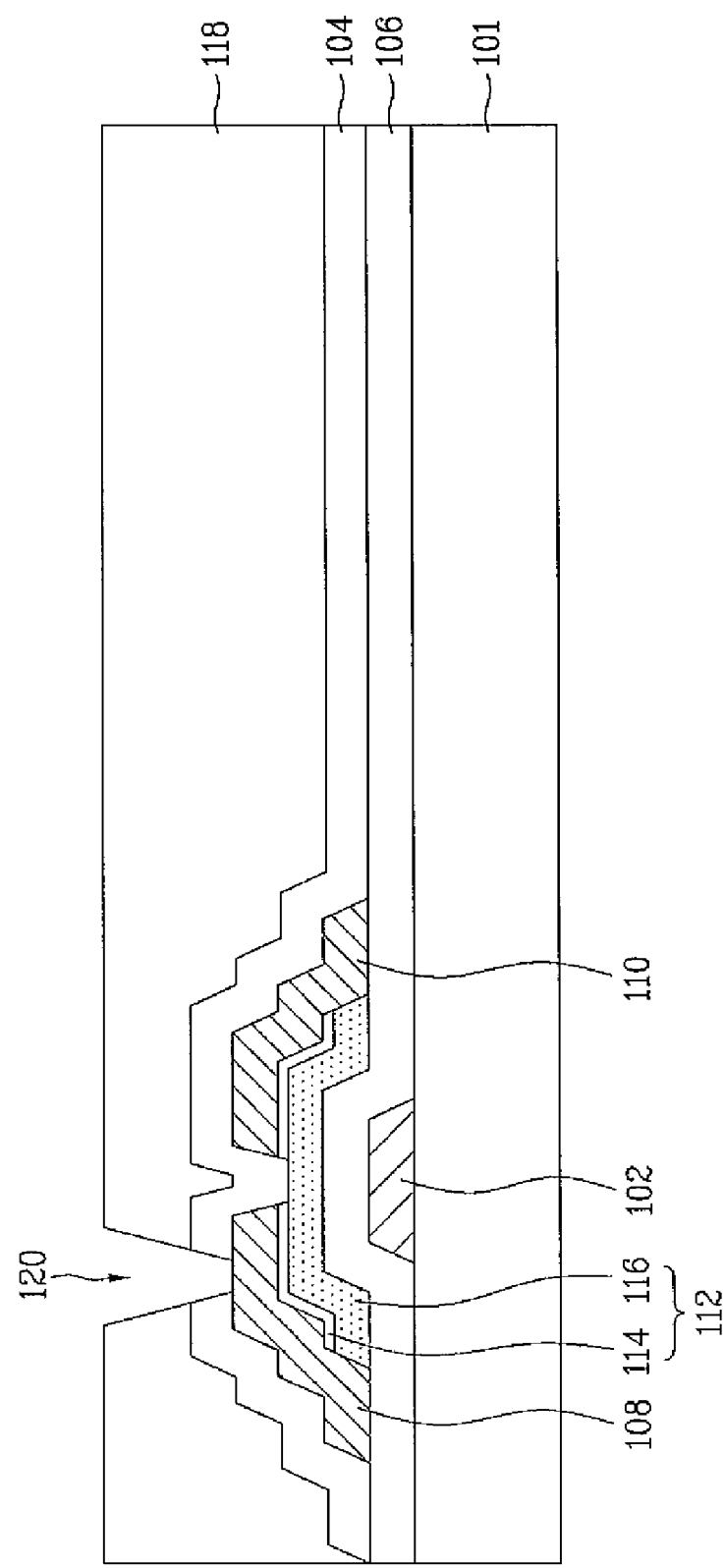

Referring to FIG. 6D, inorganic and organic passivation films 104 and 118, which include a contact hole 120 is formed, are formed on the gate insulating film 106 formed with the source/drain electrode pattern.

In detail, an inorganic passivation film 104 is formed over the gate insulating film 106 formed with the source/drain electrode pattern, in accordance with a deposition method such as a Plasma-enhanced chemical vapor deposition (PECVD) method. Thereafter, the organic passivation film 118 is formed over the inorganic passivation film 104, in accordance with a spin coating method or a spinless method. The inorganic and organic passivation films 104 and 118 are then patterned in accordance with a photolithography process and an etching process, to form the contact hole 120. Similarly to the gate insulating film 106, the inorganic passivation film 104 is made of an inorganic insulating material. Preferably, the organic passivation film 118 is made of an organic insulating film such as acryl.

Figure 6E:
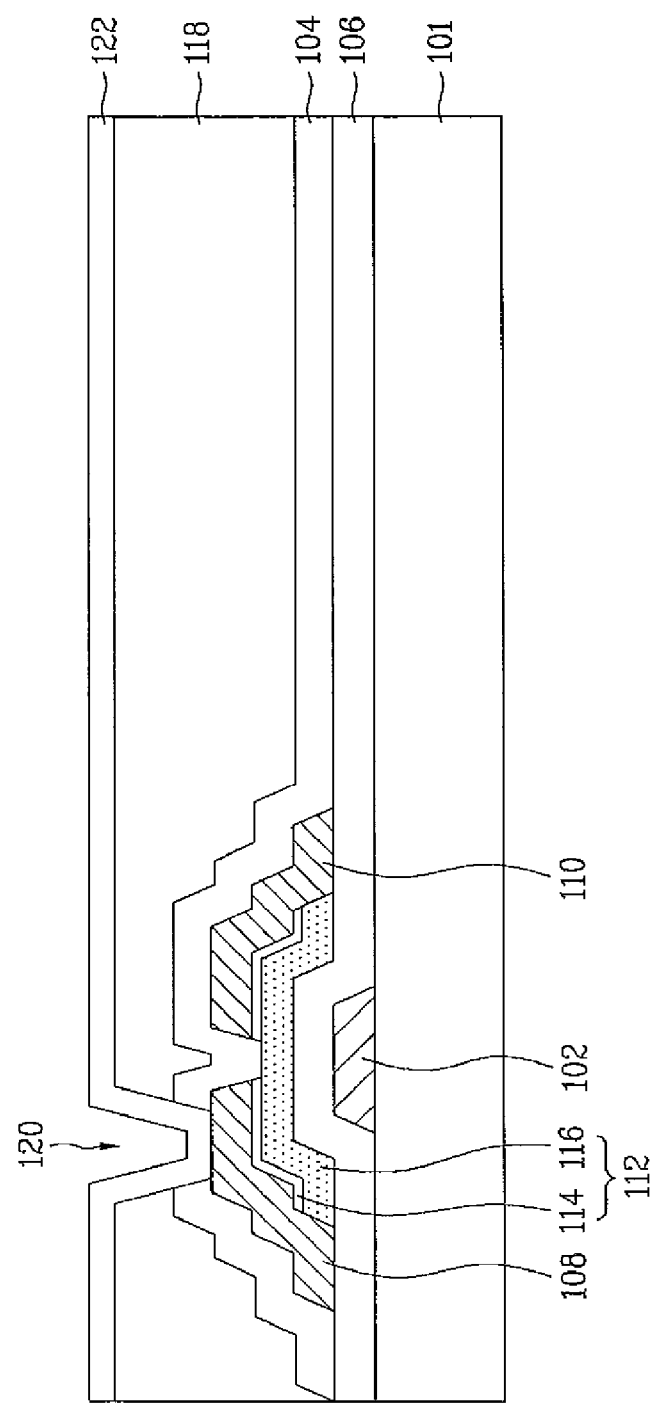

Referring to FIG. 6E, a first electrode 122 is formed on the organic passivation film 118. In detail, the formation of the first electrode 122 is achieved by depositing an opaque conductive material such as aluminum (Al) on the organic passivation film 118, in accordance with a deposition method such as a sputtering method. The first electrode 122 is connected to the drain electrode 108 via the contact hole 120.

Figure 6F:
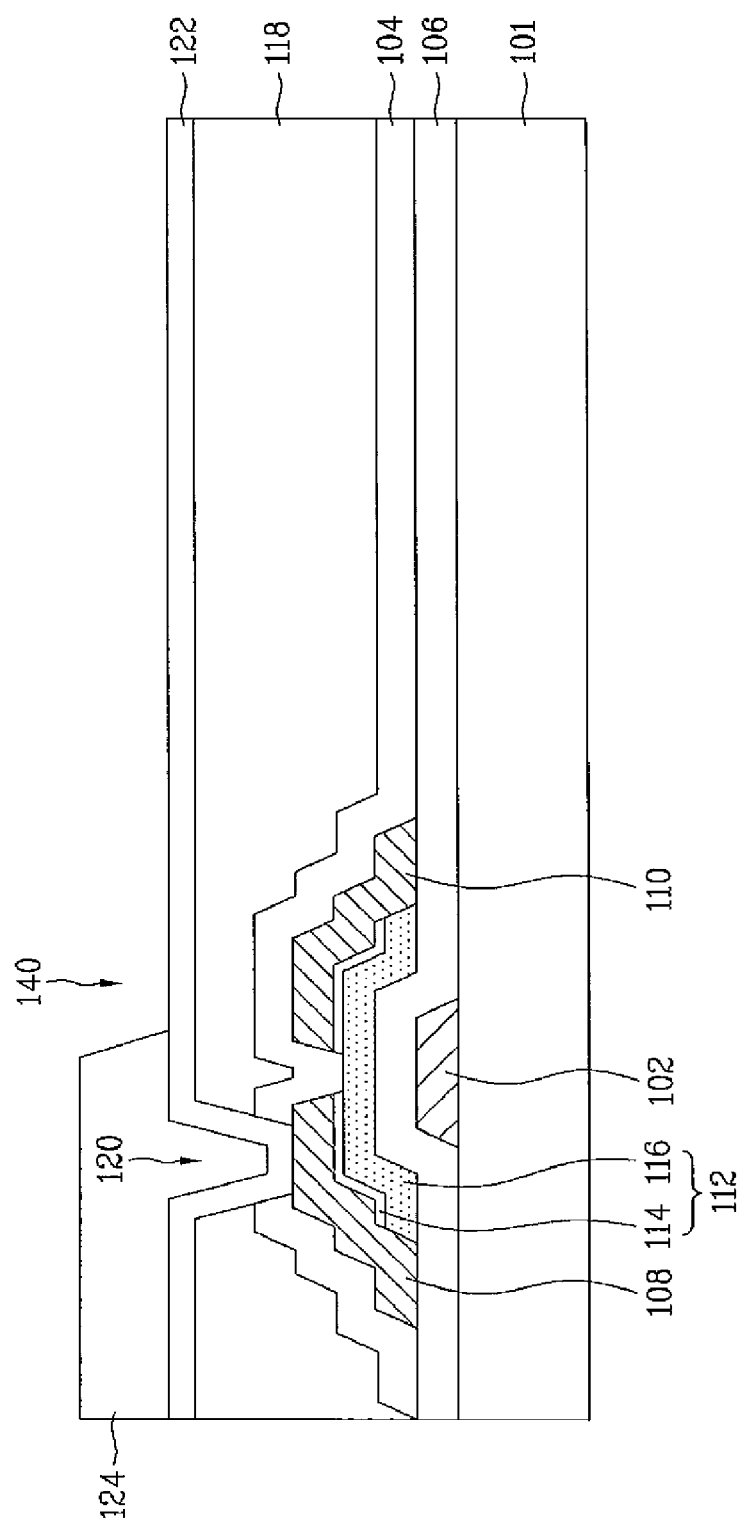

Referring to FIG. 6F, a bank insulating film 124, which includes an organic hole 140, is formed on with a portion of the first electrode 122.

In detail, a photosensitive organic insulating material is coated over the entire upper surface of the lower substrate 101 formed with the first electrode 122, in accordance with a coating method such as a spinless coating method or a spin coating method, to form the bank insulating film 124. The bank insulating film 124 is then patterned in accordance with a photolithography process, to form the organic hole 140, through which the first electrode 122 is exposed.

Figure 6G:
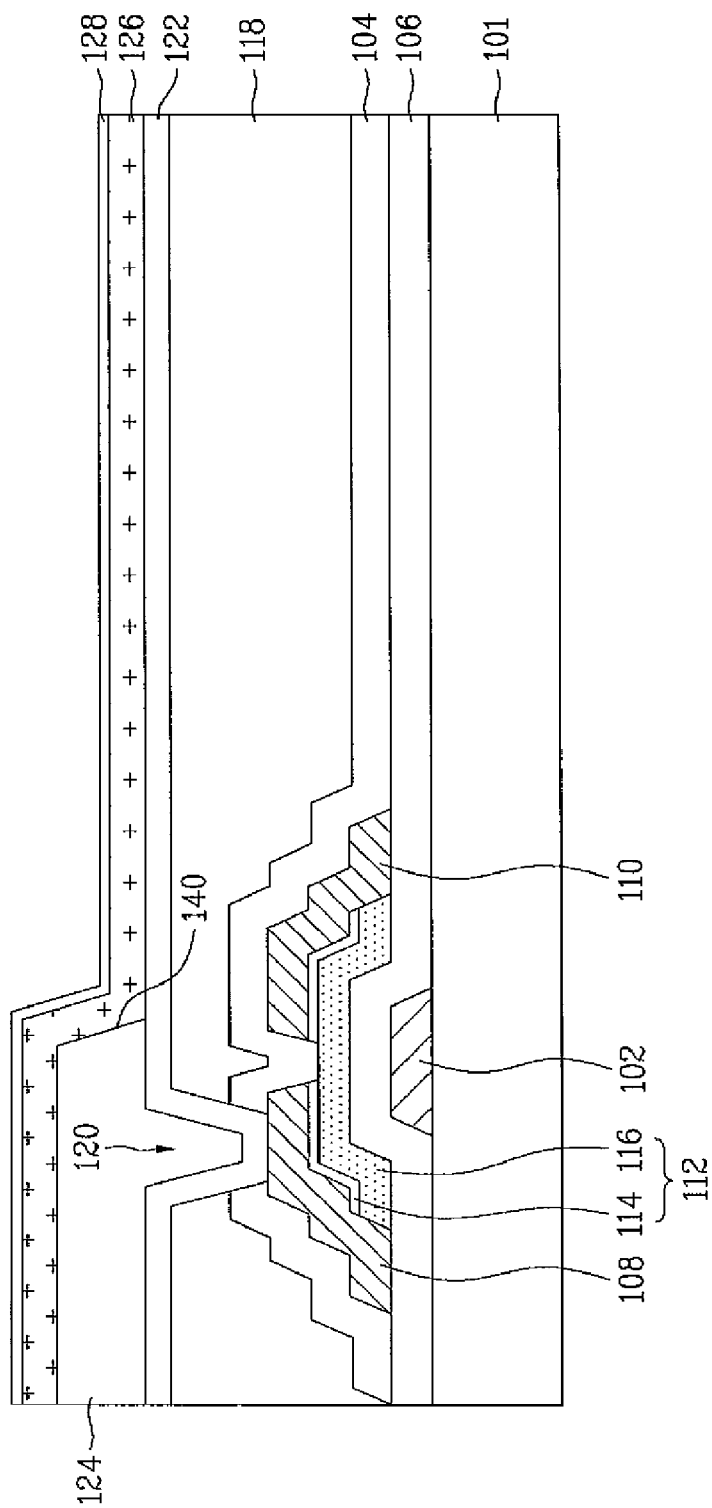

Referring to FIG. 6G, an organic layer 126 and a second electrode 128 are sequentially formed on the lower substrate 101 formed with the bank insulating film 124 including the organic hole 140. In detail, an organic layer 126, which includes an electron injection layer (EIL), an electron transport layer (ETL), a luminescence layer, a hole transport layer (HTL), and a hole injection layer (HIL), is formed on the first electrode 122 in accordance with a thermal deposition method, a sputtering method, or a combination thereof, or any other method. Thereafter, the second electrode 128 is formed on the lower substrate 101 formed with the organic layer 126.

The second electrode 128 may be formed in the form of a thin film, using a transparent conductive material or a metal material, to have a structure having at least one layer, or using both the transparent conductive material and the metal material, to have a multilayer structure. The second electrode 128 has a thickness capable of allowing light emitted from the organic layer 126 to pass therethrough, without causing an influence on the organic layer 126 during the deposition process for the second electrode 128. Preferably, the second electrode 128 has a thickness of about 10 to 500 Å.

Figure 6H:
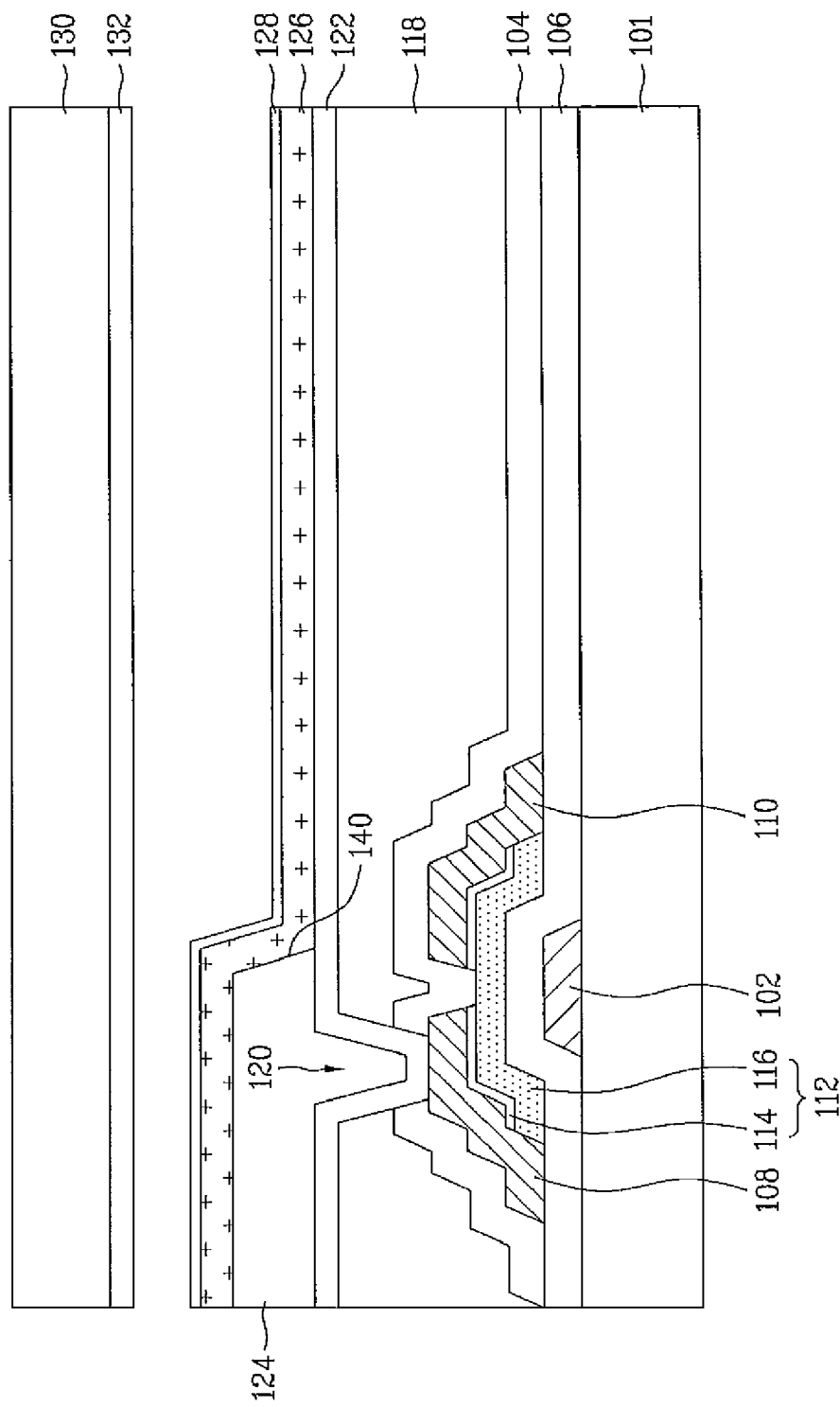

Referring to FIG. 6H, the upper substrate 130, which is formed with an auxiliary electrode 132, is vacuum-assembled with the lower substrate, which is formed with the first electrode 122, organic layer 126, and second electrode 128, to form a luminescence display panel. In detail, a transparent conductive layer, which has a structure having at least one layer, is formed over the upper substrate 130 in accordance with a deposition method such as a sputtering method, to form the auxiliary electrode 132. The transparent conductive layer is made of a transparent conductive material such as ITO or IZO. Alternatively, the auxiliary electrode 132 is made of a plurality of conductive layers formed on the upper substrate 101. In this case, a transparent conductive material, a metal layer having a thin film structure, and a transparent conductive material may be sequentially formed. In addition, the auxiliary electrode 132 may be subjected to a surface treatment using plasma or ultraviolet rays, to increase the work function of the auxiliary electrode 132. In this case, an enhancement in electrical characteristics is achieved. Thereafter, the upper substrate 130 formed with the auxiliary electrode 132 is vacuum-assembled with the lower substrate 101 formed with the TFTs, first electrode 122, organic layer 126, and second electrode 128. Then, the luminescence display panel is formed.

The luminescence display panel and the fabricating method thereof according to the first embodiment of the present invention can prevent a degradation in picture quality because it is possible to form the auxiliary electrode 132 on the organic layer 126 without damaging the organic layer 126. In addition, the luminescence display panel and the fabricating method thereof according to the first embodiment of the present invention can also enhance the characteristics of the organic layer 126, auxiliary electrode 132, and upper passivation film 134 because the auxiliary electrode 132 and upper passivation film 134 can be deposited on the upper substrate 130 at high temperature, without taking into consideration the possibility of damaging the organic layer 126 formed on the lower substrate 101.

Figure 7:
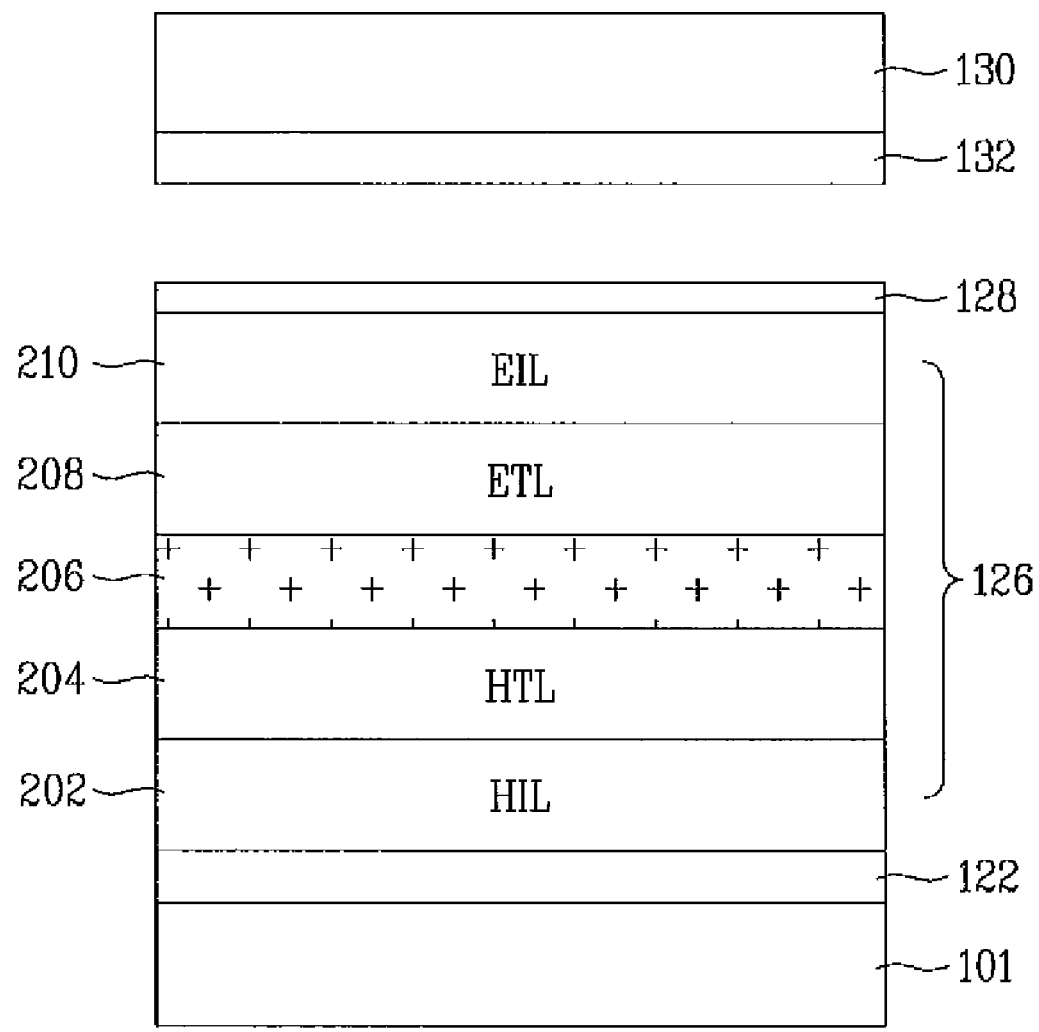
FIG. 7 is a view illustrating an organic layer of a luminescence display panel according to a second embodiment of the present invention.

FIG. 7 is a view illustrating an organic layer of a luminescence display panel according to a second embodiment of the present invention. The luminescence display panel according to the second embodiment of the present invention is identical to that of the first embodiment, except for an OEL cell. Accordingly, no description will be given of the same configuration.

The OEL cell of the luminescence display panel according to the second embodiment of the present invention includes a first electrode 122 formed on an inorganic passivation film 104 and organic passivation film 118 covering a drive TFT, a bank insulating film 124 formed with an organic hole 140, through which the first electrode 122 is partially exposed, an organic layer 126 including a luminescence layer formed on the portion of the first electrode 122 exposed through the organic hole 140, a second electrode 128 formed on the organic layer 126, and an auxiliary electrode 132 formed on an upper substrate 130, as shown in FIG. 2.

The first electrode 122, which functions as an anode, is made of a metal material and an opaque conductive material. For example, the first electrode 122 is made of a metal material having a high reflectivity, such as aluminum (Al), silver (Ag), or molybdenum (Mo), and a transparent material such as ITO.

The organic layer 126 is formed by sequentially forming, on the first electrode 122, an hole injection layer 202, an hole transport layer 204, a luminescence layer 206, an electron transport layer 208, and an electron injection layer 210. The luminescence layer 206 included in the organic layer 126 emits light of a particular wavelength from the upper surface thereof toward the upper substrate 130 as exciters generated in accordance with re-coupling of electrons from the auxiliary electrode 132 and second electrode 128 and holes from the first electrode 122 return to a ground state.

The auxiliary electrode 132 is formed on the upper substrate 130 such that it is connected with the second electrode 128 formed on the organic layer 126. The second electrode 128 is formed on the organic layer 126 in the form of a thin film. The second electrode 128 may have a structure having at least one layer using a transparent conductive material such as TCO or a metal material such as aluminum-silver (AlAg), or may have a multi layer structure using the transparent conductive material and metal material.

The second electrode 128, which functions as a cathode, is formed using a thermal deposition method, a sputtering method, or a combination thereof. Similarly to the first embodiment, the second electrode 128 has a thickness preventing the organic layer 126 from being adversely influenced by the deposition process for the second electrode 128. Preferably, the second electrode 128 has a thickness of about 10 to 500 Å.

The auxiliary electrode 132 is formed in the same manner as that of the first embodiment, as shown in FIGS. 3 and 4. Accordingly, the auxiliary electrode 132 has the same or similar effect as that of the first embodiment.

Figure 8:
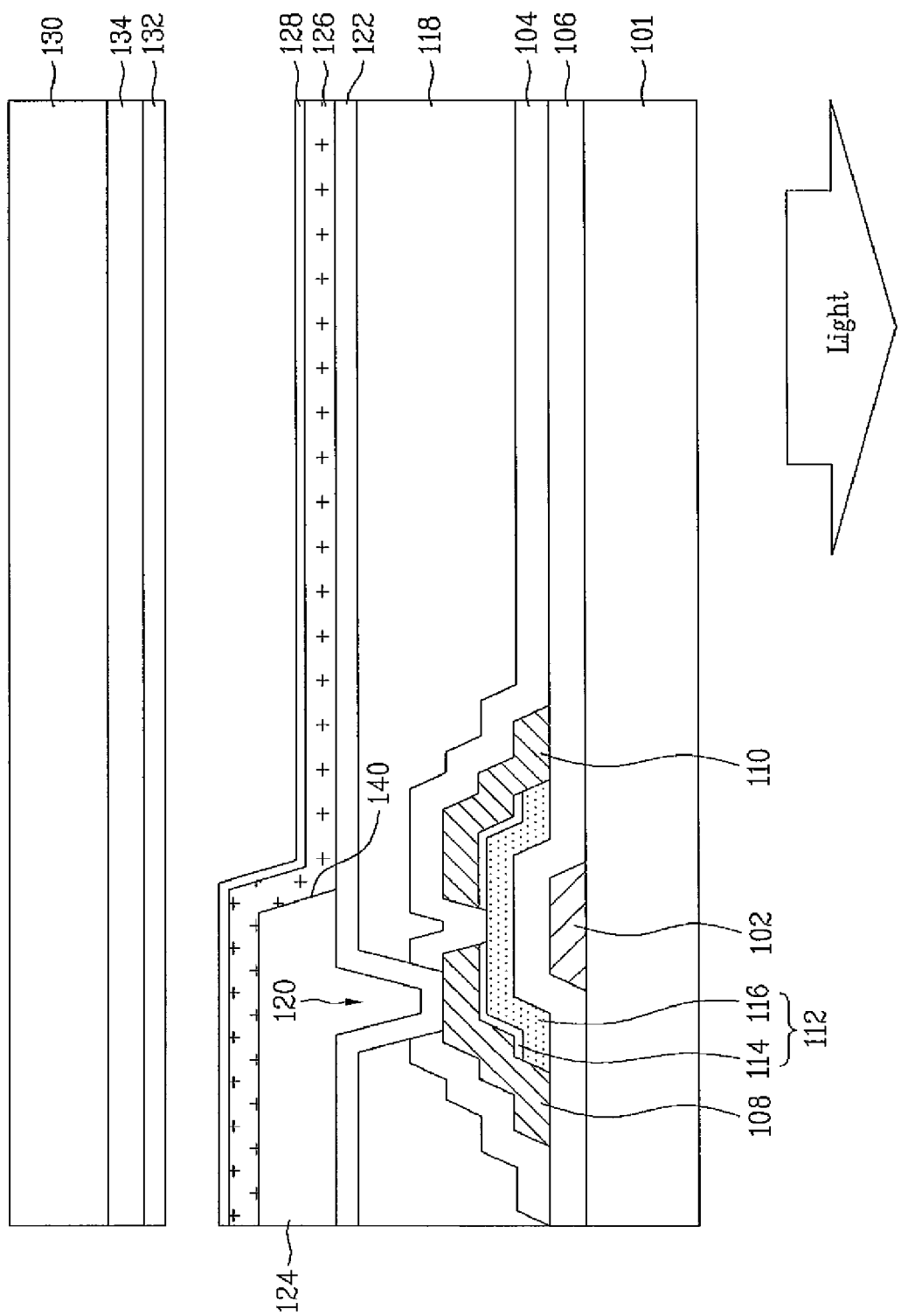
FIG. 8 is a sectional view of a luminescence display panel according to a third embodiment of the present invention.

FIG. 8 is a sectional view of a luminescence display panel according to a third embodiment of the present invention. The luminescence display panel according to the third embodiment of the present invention is identical to that of the first embodiment, except for an OEL cell configured to achieve a rear-side light emission. Accordingly, no description will be given of the same configuration.

Referring to FIG. 8, the first electrode 122 in the luminescence display panel according to the third embodiment of the present invention functions as an anode, and is made of a transparent conductive material. For example, the first electrode 122 is made of ITO, IZO, or IZO.

In accordance with the third embodiment, the organic layer 126 is formed by sequentially forming, on the first electrode 122, a hole injection layer (HIL), a hole transport layer (HTL), a luminescence layer, an electron transport layer (ETL), and an electron injection layer (EIL). The luminescence layer included in the organic layer 126 emits light of a particular wavelength from the upper surface thereof toward a lower substrate 101 as exciters generated in accordance with re-coupling of electrons from an auxiliary electrode 132 and a second electrode 128 and holes from the first electrode 122 return to a ground state.

The auxiliary electrode 132 is formed on the upper substrate 130, using aluminum (Al), copper (Cu), magnesium (Mg), and silver (Ag), to have a structure having at least one layer. However, the auxiliary electrode may be made of other materials, which are not limited to the above. The auxiliary electrode 132 formed on the upper substrate 130 is connected with the second electrode 128 formed on the organic layer 126.

The second electrode 128 is formed on the organic layer 126 in the form of a thin film. The second electrode 128 may have a structure having at least one layer using a transparent conductive material such as TCO or a metal material, or may have a multi layer structure using the transparent conductive material and metal material. The second electrode 128 is formed in the same manner as that of the first embodiment. Accordingly, the second electrode 128 has the same or similar effect as that of the first embodiment.

The auxiliary electrode 132 may be formed on the upper substrate 130 formed with an upper passivation film 134, as shown in FIGS. 4 and 5. The auxiliary electrode 132 may have an embossing structure, as shown in FIG. 5.

Figure 9:
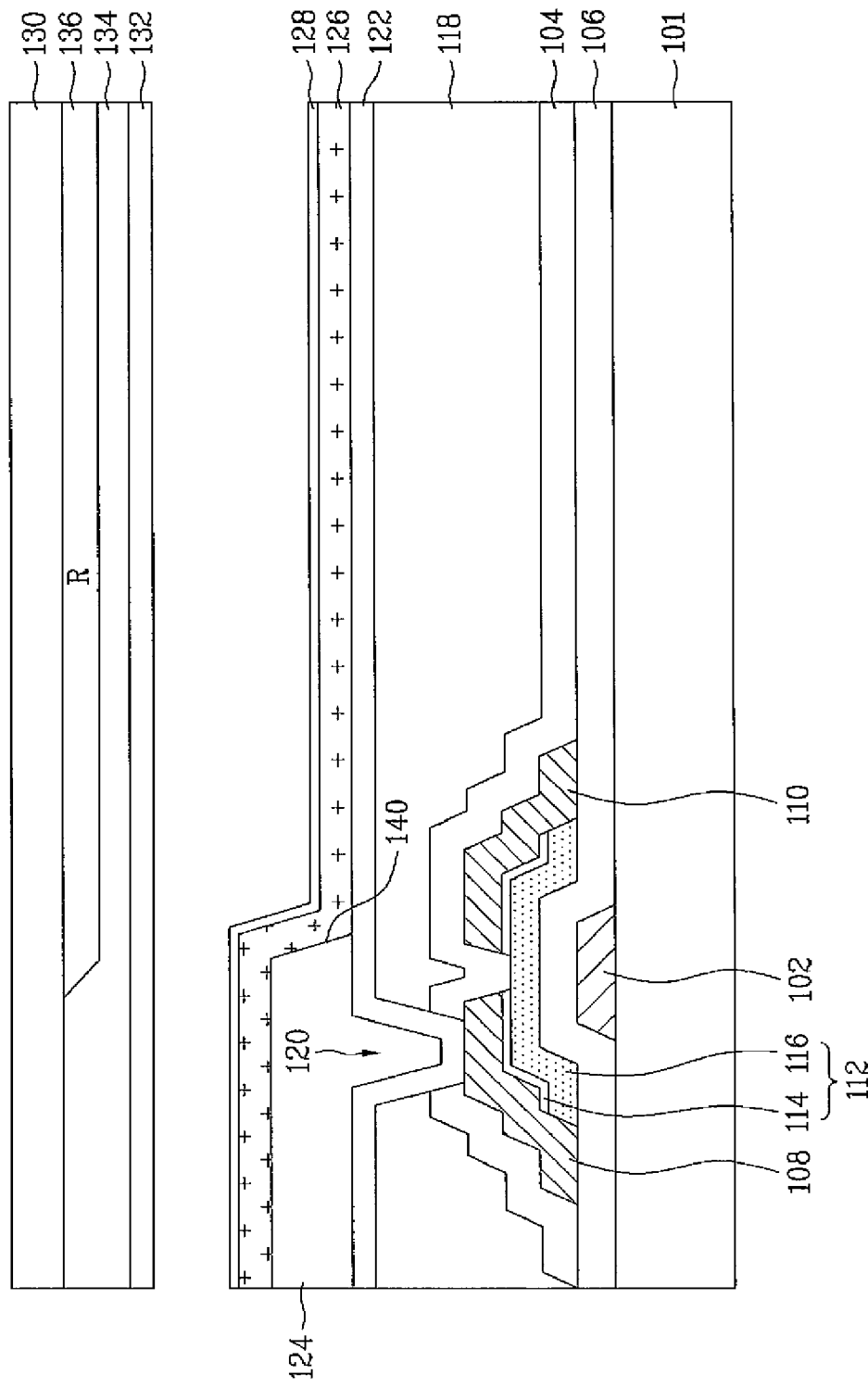
FIG. 9 is a vertical sectional view illustrating one pixel of a luminescence display panel according to a fourth embodiment of the present invention.
Figure 10:
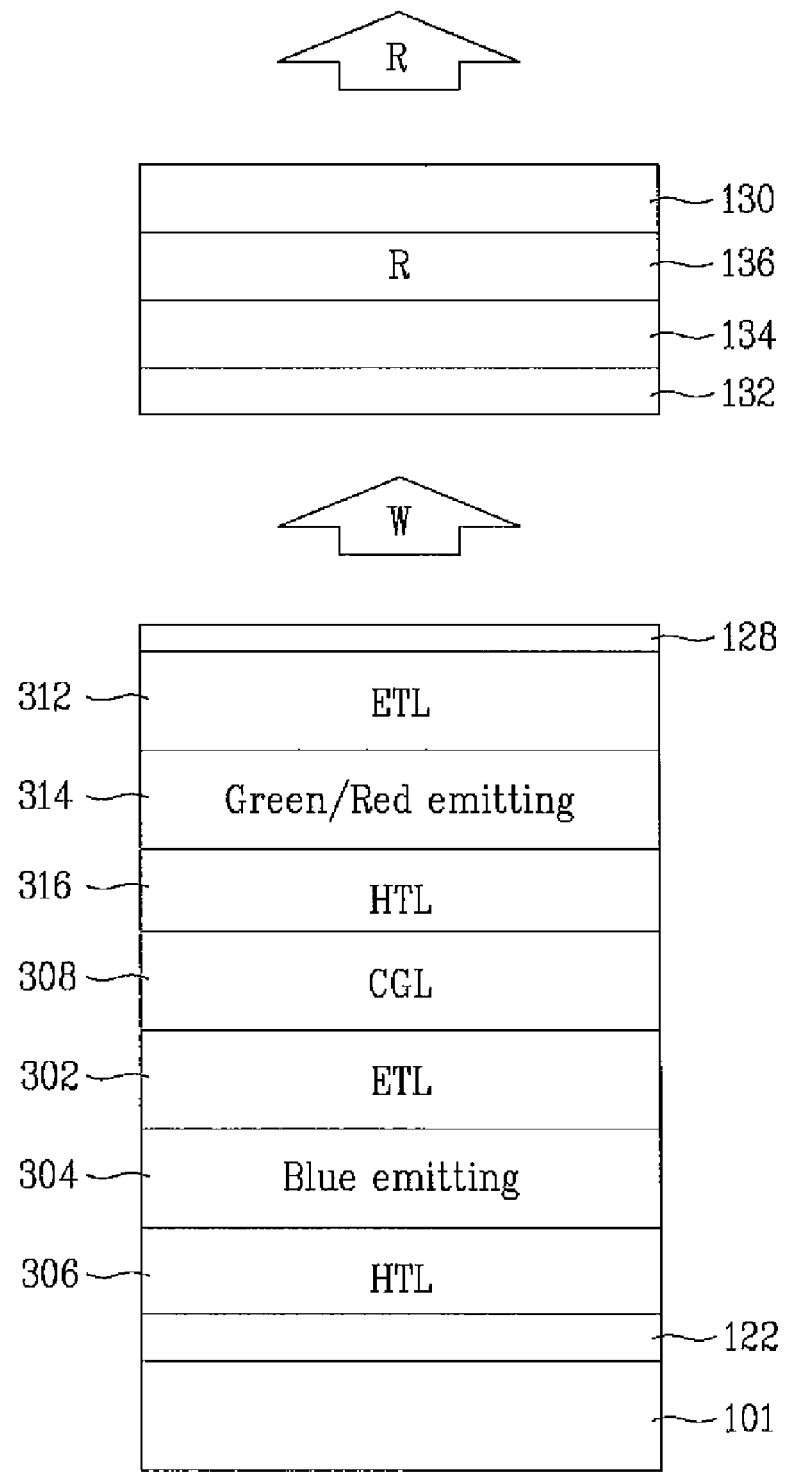
FIG. 10 is a sectional view for concretely explaining an organic layer included in the luminescence display panel shown in FIG. 9.

FIG. 9 is a vertical sectional view illustrating one pixel of a luminescence display panel according to a fourth embodiment of the present invention. FIG. 10 is a sectional view for concretely explaining an organic layer included in the luminescence display panel shown in FIG. 9.

The luminescence display panel according to the fourth embodiment of the present invention shown in FIGS. 9 and 10 includes the same constituent elements as those of the first embodiment, except for an OEL cell and an upper substrate structure. Accordingly, no description will be given of the same configuration.

Formed on an upper substrate 130 are an auxiliary electrode 132 connected to a second electrode 128 of a drive TFT T2, color filters 136 formed on the upper substrate 130, and an overcoat layer 134 formed between the color filters 136 and the auxiliary electrode 132.

The first electrode 122 is made of a metal material and a transparent conductive material. For example, the first electrode 122 is made of a metal material having a high reflectivity, such as aluminum (Al), silver (Ag), or molybdenum (Mo), and a transparent material such as ITO.

A second electrode 128 is formed on an organic layer 126 in the form of a thin film. The second electrode 128 may have a structure having at least one layer using a transparent conductive material such as TCO or a metal material such as aluminum (Al) or silver (Ag), or may have a multi layer structure using the transparent conductive material and metal material. The second electrode 128 may be formed using a thermal deposition method, a sputtering method, or a combination thereof. Even when the second electrode 128 is deposited on the organic layer 126, using a sputtering method, there is no damage to the organic layer 126 because the second electrode is formed in the form of a thin film having no adverse influence on the organic layer 126. The second electrode 128 is thinner than one of or both of the first electrode 122 and auxiliary electrode 132. Preferably, second electrode 128 has a thickness of about 10 to 500 Å.

As shown in FIG. 10, the organic layer 126 is formed by sequentially forming, on the first electrode 122, a first hole transport layer (HTL) 306, a first emission layer 304, an first electron transport layer (ETL) 302, a charge generation layer (CGL) 308, a second hole transport layer (HTL) 316, a second emission layer 314, and a second electron transport layer (ETL) 312. The first emission layer 304 is a blue emission layer, and the second emission layer 314 is a green/red emission layer.

The color filters 136 include red (R), green (G), and blue (B) color filters to render color. The color filters 136 are formed on the upper substrate 130 such that it emits light of R, G, and B in respective pixel regions. Further, the overcoat layer 134 is formed between the color filters 136 and the auxiliary electrode 132, to planarize the surfaces of the color filters 136.

Figure 11:
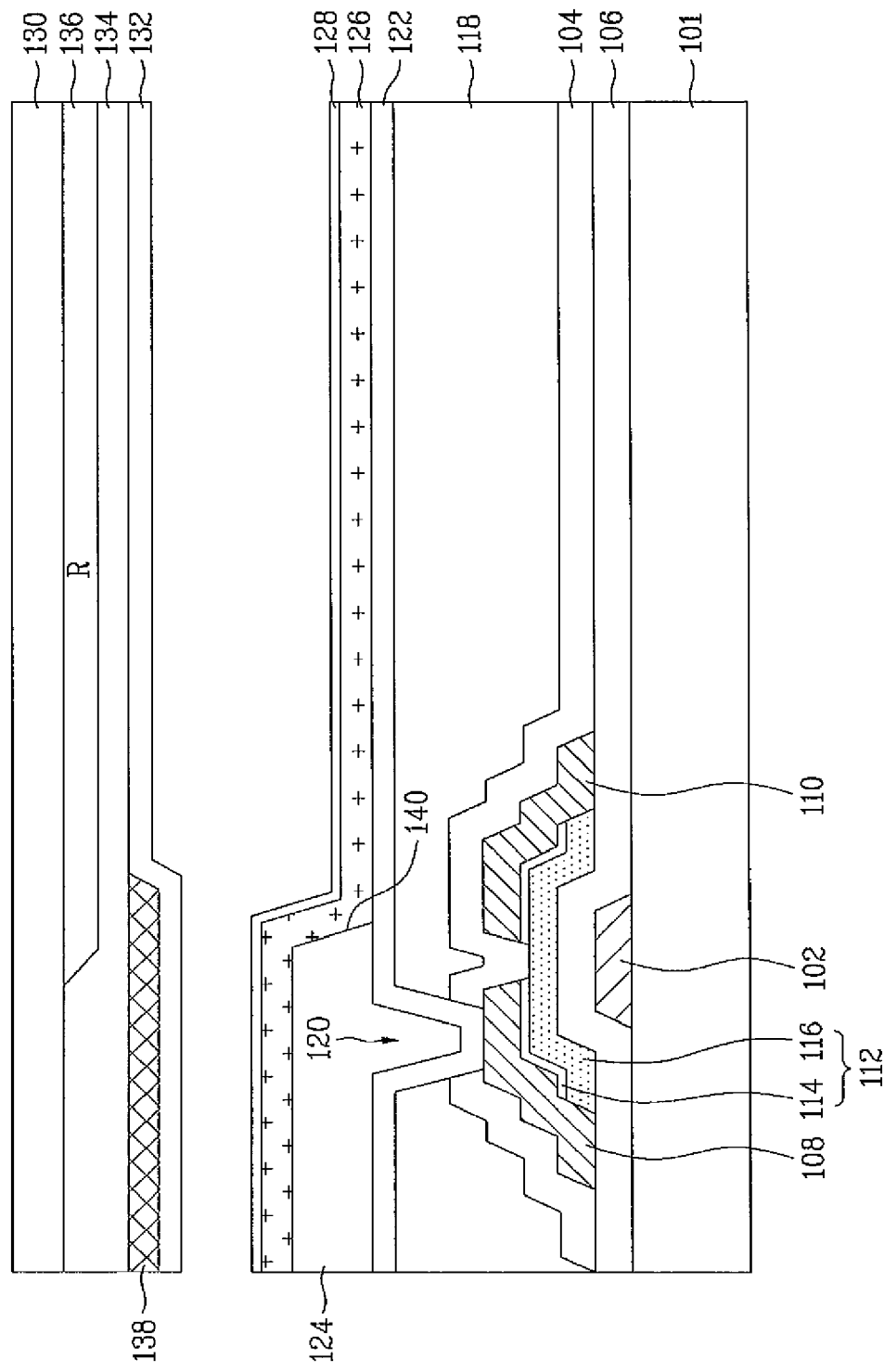
FIG. 11 is a sectional view illustrating another embodiment of an auxiliary electrode shown in FIG. 10.

The auxiliary electrode 132 is formed to have a structure having at least one layer, preferably using a TCO material such as ITO or IZO. Alternatively, the auxiliary electrode 132 may be formed, using a transparent conductive material and a metal layer having a thin film structure, in order to have a multilayer structure. The metal layer included in the auxiliary electrode 132 has a thickness capable of allowing light to pass therethrough, namely, a thickness of about 10 to 500 Å. Where the auxiliary electrode 132 is formed to have at least two layers, it is possible to reduce the contact resistance of the auxiliary electrode 132 generated when the auxiliary electrode 132 comes into contact with the second electrode 128. As shown in FIG. 11, a metal layer as a bus electrode 138 is formed on the upper substrate 130, in order to compensate the contact resistance between the auxiliary electrode 132 and the second electrode 128. In this case, the bus electrode 138 is formed between the overcoat layer 134 and the auxiliary electrode 132 at a position corresponding to the region where the second electrode 128 and auxiliary electrode 132 of the OEL cell are connected.

The organic layer 126 emits white light from the upper surface thereof toward the upper substrate 130 as exciters generated in accordance with re-coupling of holes from the first electrode 122 and electrons from the second electrode 128 return to a ground state. In this luminescence display panel, white light from the organic layer 126 is emitted toward the upper substrate 130. As the second electrode 128 of the OEL cell and the auxiliary electrode 132 formed on the upper substrate 130 are connected, the white light passes through the R, C, and B color filters 136 formed in respective pixel regions. Accordingly, R, G, or B light is displayed in an associated one of the pixel regions.

As R, C, and B colors are displayed using white light, it is possible to achieve an enhancement in color reproducibility. Also, an enhancement in aperture ratio is achieved in accordance with the front surface light emission.

FIGS. 12A to 12D are sectional views for explaining a method for fabricating a luminescence display panel according to a fourth embodiment of the present invention.

Figure 12A:
FIGS. 12A to 12D are sectional views for explaining a method for fabricating a luminescence display panel according to a fourth embodiment of the present invention.

Referring to FIG. 12A, R, G, and B color filters 136 are formed on an upper substrate 130.

In detail, R, G, and B color layers having a photosensitivity are coated on the upper substrate 130, and are then patterned in accordance with a photo process, to form R, G, and B color filters 136 in corresponding sub-pixel regions, respectively.

Figure 12B:
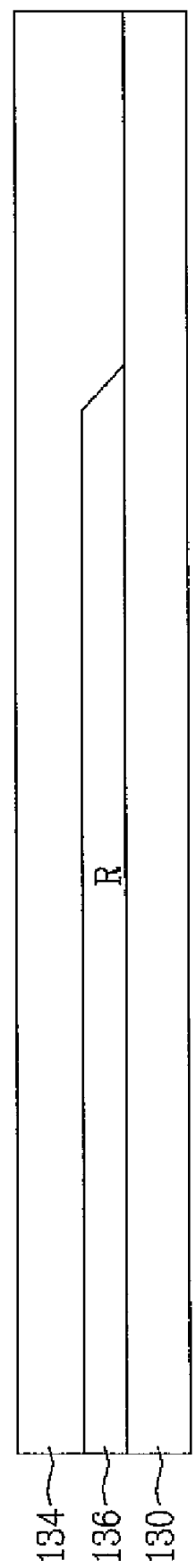

Referring to FIG. 12B, an overcoat layer 134 is formed over the upper substrate 130 formed with the R, G, and B color filters 136.

In detail, the formation of the overcoat layer 134 is achieved by coating an organic insulating material over the upper substrate 130 formed with the R, G, and B color filters 136, in accordance with a coating method such as a spinless coating method or a spin coating method.

Figure 12C:
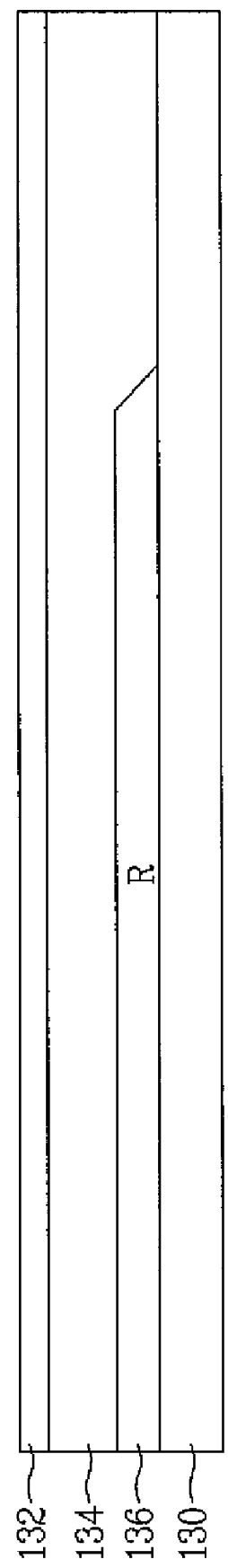

Referring to FIG. 12C, an auxiliary electrode 132 is formed on the upper substrate 130 formed with the overcoat layer 134.

In detail, the formation of the auxiliary electrode 132 is achieved by depositing a transparent conductive layer, which has a structure having at least one layer, over the upper substrate 130 in accordance with a deposition method such as a sputtering method. For the transparent conductive material, ITO or IZO may be used. Alternatively, the auxiliary electrode 132 may be formed on the upper substrate 130, to have a multi-layer structure including a layer made of a transparent conductive material and a metal layer having a thin film structure. The auxiliary electrode 132 may be subjected to a surface treatment using plasma or ultraviolet rays, to increase the work function of the auxiliary electrode 132. In this case, an enhancement in electrical characteristics is achieved.

Figure 12D:
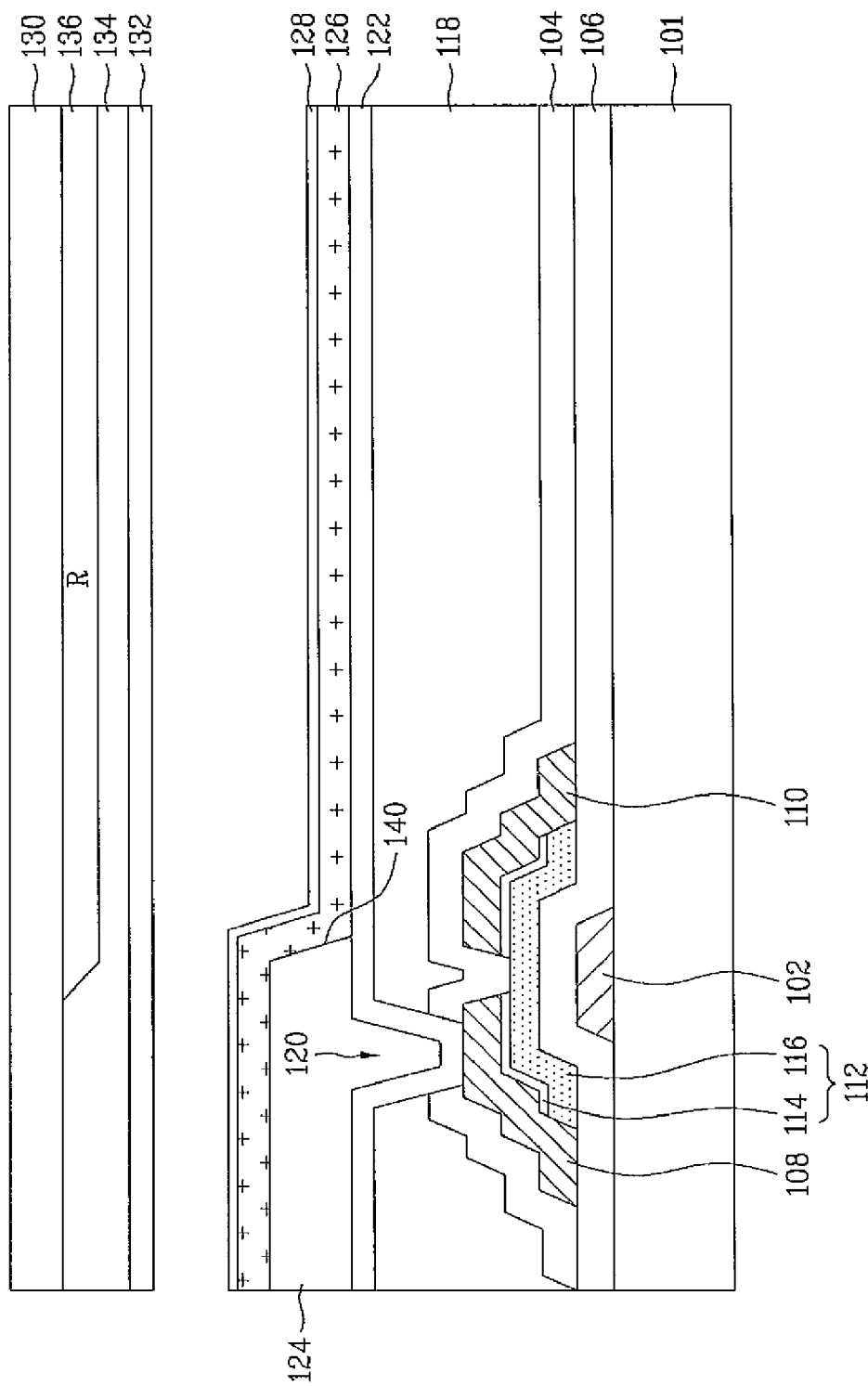

As shown in FIG. 12D, the upper substrate 130, which is formed with the R, G, and B color filters 136, overcoat layer 134, and auxiliary electrode 132, is then vacuum-assembled with the lower substrate 101 formed with the TFTs, first electrode 122, organic layer 126, and second electrode 128. Thus, the luminescence display panel is formed. In this case, the lower substrate 101, which is formed with the TFTs, first electrode 122, organic layer 126, and second electrode 128, is formed using the fabricating method shown in FIGS. 6A to 6G. Since this fabricating method was previously described, no detailed description thereof will be given.

Where the second electrode 128 is formed on the organic layer 126, it may be deposited in the form of a thin film, in order to prevent the organic layer 126 from being damaged. As the auxiliary electrode 132 connected to the second electrode 128 is formed on the upper substrate 130, it is possible to perform a high-temperature process, without taking into consideration any damage to the organic layer 126. As the high-temperature process is applicable, an enhancement in film characteristics can be achieved.

Figure 13:
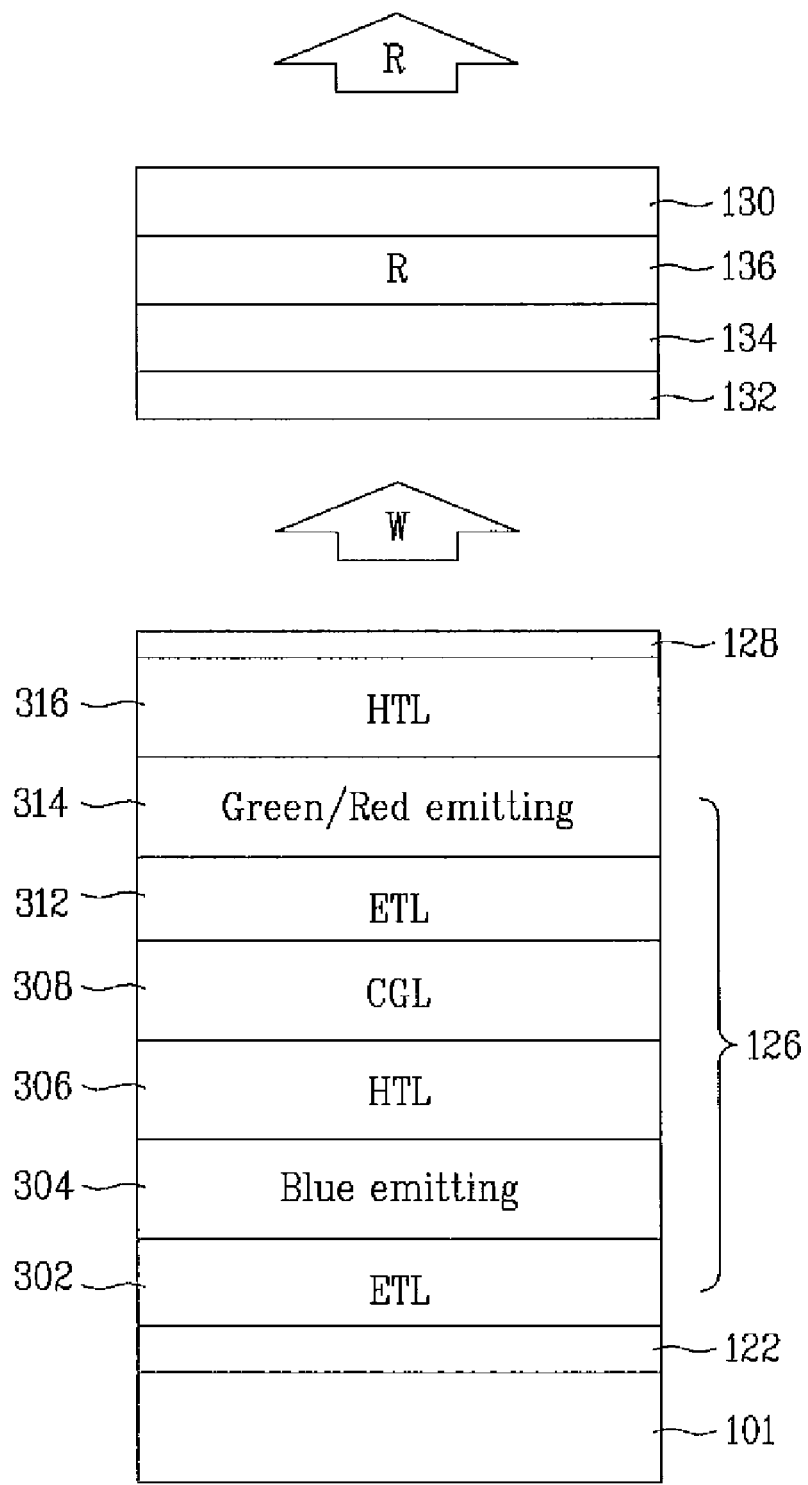
FIG. 13 is a sectional view briefly illustrating a luminescence display panel according to a fifth embodiment of the present invention.

FIG. 13 is a sectional view briefly illustrating a luminescence display panel according to a fifth embodiment of the present invention.

The luminescence display panel according to the fifth embodiment of the present invention is identical to that of the first embodiment, except for an OEL cell. Accordingly, no description will be given of the same configuration.

The first electrode 122 in the OEL cell of the luminescence display panel according to the fifth embodiment of the present invention is made of an opaque conductive material such as aluminum (Al).

The second electrode 128 is formed on the organic layer 126 in the form of a thin film. The second electrode 128 may have a structure having at least one layer using a transparent conductive material such as TCO or a metal material such as aluminum (Al) or silver (Ag), or may have a multi layer structure using the transparent conductive material and metal material. The second electrode 128 may be formed using a thermal deposition method, a sputtering method, or a combination thereof. Even when the second electrode 128 is deposited on the organic layer 126, using a sputtering method, there is no damage to the organic layer 126 because the second electrode is formed in the form of a thin film having no adverse influence on the organic layer 126. The second electrode 128 is thinner than one of or both of the first electrode 122 and auxiliary electrode 132. For example, the second electrode 128 has a thickness of about 10 to 500 Å.

The organic layer 126 is formed by sequentially forming, on the first electrode 122, a first electron transport layer 302, a first emission layer 304, a first hole transport layer 306, a charge generation layer 308, a second electron transport layer 312, a second emission layer 314, and a second hole transport layer 316. The first emission layer 304 is a blue emission layer, and the second emission layer 314 is a green/red emission layer.

The organic layer 126 emits white light from the upper surface thereof toward the upper substrate 130 as exciters generated in accordance with re-coupling of electrons from the first electrode 122 and holes from the second electrode 128 return to a ground state. In this luminescence display panel, white light from the organic layer 126 is emitted toward the upper substrate 130. As the second electrode 128 of the OEL cell and the auxiliary electrode 132 of the upper substrate 130 are connected, the white light passes through R, G, and B color filters 136 formed in respective pixel regions. Accordingly, R, G, or B light is displayed in an associated one of the pixel regions.

Figure 14:
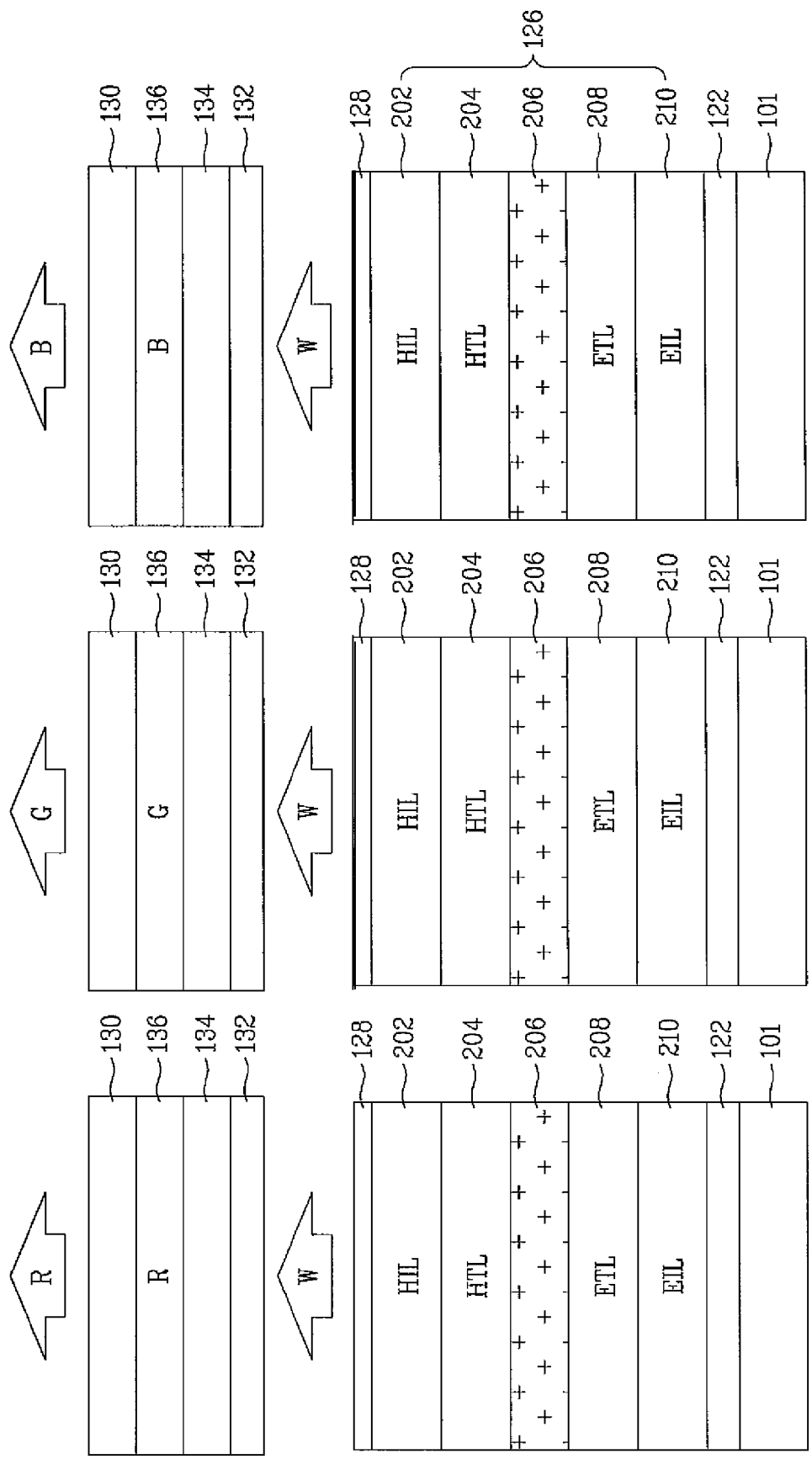
FIG. 14 is a sectional view briefly illustrating a luminescence display panel according to a sixth embodiment of the present invention.

FIG. 14 is a sectional view briefly illustrating a luminescence display panel according to a sixth embodiment of the present invention.

The luminescence display panel according to the sixth embodiment of the present invention is identical to that of the first embodiment, except for an OEL cell. Accordingly, no description will be given of the same configuration.

The first electrode 122 in the OEL cell of the luminescence display panel according to the sixth embodiment of the present invention is made of an opaque conductive material. For example, the first electrode 122 is made of an opaque conductive material having a high reflectivity, such as aluminum (Al), molybdenum (Mo), or silver (Ag).

The second electrode 128 is formed on the organic layer 126 in the form of a thin film. The second electrode 128 may have a structure having at least one layer using a transparent conductive material such as TCO or a metal material such as aluminum-silver (AlAg), or may have a multi layer structure using the transparent conductive material and metal material. The second electrode 128 may be formed using a thermal deposition method, a sputtering method, or a combination thereof. Even when the second electrode 128 is deposited on the organic layer 126, using a sputtering method, there is no damage to the organic layer 126 because the second electrode is formed in the form of a thin film having no adverse influence on the organic layer 126. The second electrode 128 has a thin film structure having a thickness of, for example, about 10 to 500 Å.

The organic layer 126 is formed by sequentially forming, on the first electrode 122, an electron injection layer (EIL) 210, an electron transport layer (ETL) 208, a white emission layer 206, a hole transport layer (HTL) 204, and a hole injection layer (HIL) 202. The organic layer 126 emits white light from the upper surface thereof toward the upper substrate 130 as exciters generated in accordance with re-coupling of electrons from the first electrode 122 and holes from the second electrode 128 return to a ground state. In this luminescence display panel, white light from the organic layer 126 is emitted toward the upper substrate 130. AS the second electrode 128 of the OEL cell and the auxiliary electrode 132 of the upper substrate 130 are connected, the white light passes through R, G, and B color filters 136 formed in respective pixel regions. Accordingly, R, G, or B light is displayed in an associated one of the pixel regions.

Figure 15:
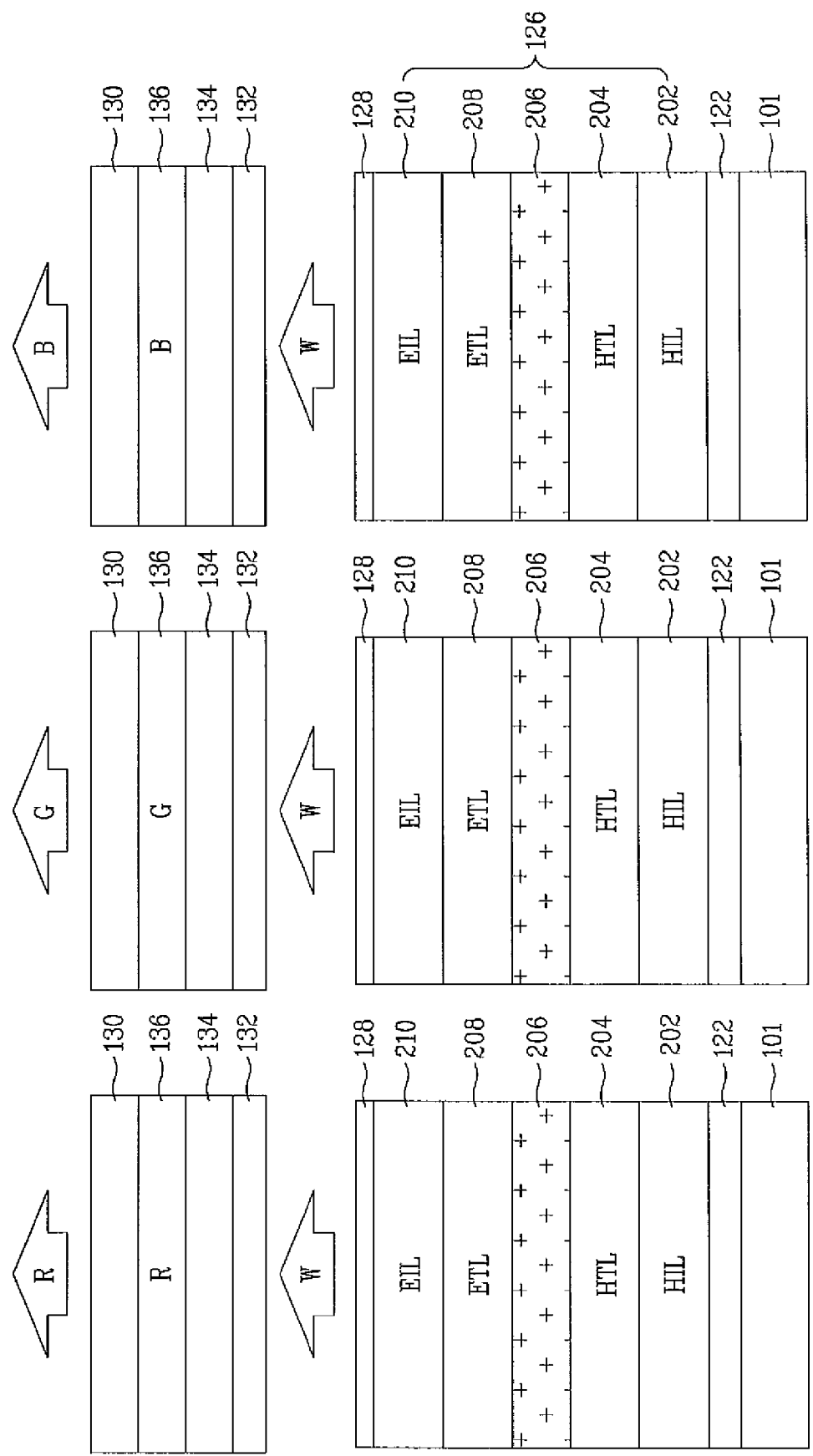
FIG. 15 is a sectional view briefly illustrating a luminescence display panel according to a seventh embodiment of the present invention.

FIG. 15 is a sectional view briefly illustrating a luminescence display panel according to a seventh embodiment of the present invention. The luminescence display panel according to the seventh embodiment of the present invention is identical to that of the first embodiment, except for an OEL cell. Accordingly, no description will be given of the same configuration.

The first electrode 122 in the OEL cell of the luminescence display panel according to the seventh embodiment of the present invention is made of a metal material and an opaque conductive material. For example, the first electrode 122 is made of a transparent conductive material such as TCO and a metal material having a high reflectivity, such as aluminum (Al), silver (Ag), or molybdenum (Mo). The second electrode 128 is formed on the organic layer 126 in the form of a thin film. The second electrode 128 may have a multi layer structure using a transparent conductive material and a metal material. The second electrode 128 may be formed using a thermal deposition method, a sputtering method, or a combination thereof. Even when the second electrode 128 is deposited on the organic layer 126, using a sputtering method, there is no damage to the second electrode 128 because the second electrode is formed in the form of a thin film having no adverse influence on the organic layer 126. The second electrode 128 has a thickness smaller than one of the first electrode 122 and auxiliary electrode 132, for example, a thickness of about 10 to 500 Å.

The organic layer 126 is formed by sequentially forming, on the first electrode 122, a hole injection layer 202, a hole transport layer 204, a white emission layer 206, an electron transport layer 208, and an electron injection layer 210. The organic layer 126 emits white light from the upper surface thereof toward the upper substrate 130 as exciters generated in accordance with re-coupling of holes from the first electrode 122 and electrons from the second electrode 128 return to a ground state. In this luminescence display panel, white light from the organic layer 126 is emitted toward the upper substrate 130. As the second electrode 128 of the OEL cell and the auxiliary electrode 132 of the upper substrate 130 are connected, the white light passes through R, G, and B color filters 136 formed in respective pixel regions. Accordingly, R, G, or B light is displayed in an associated one of the pixel regions.

Figure 16:
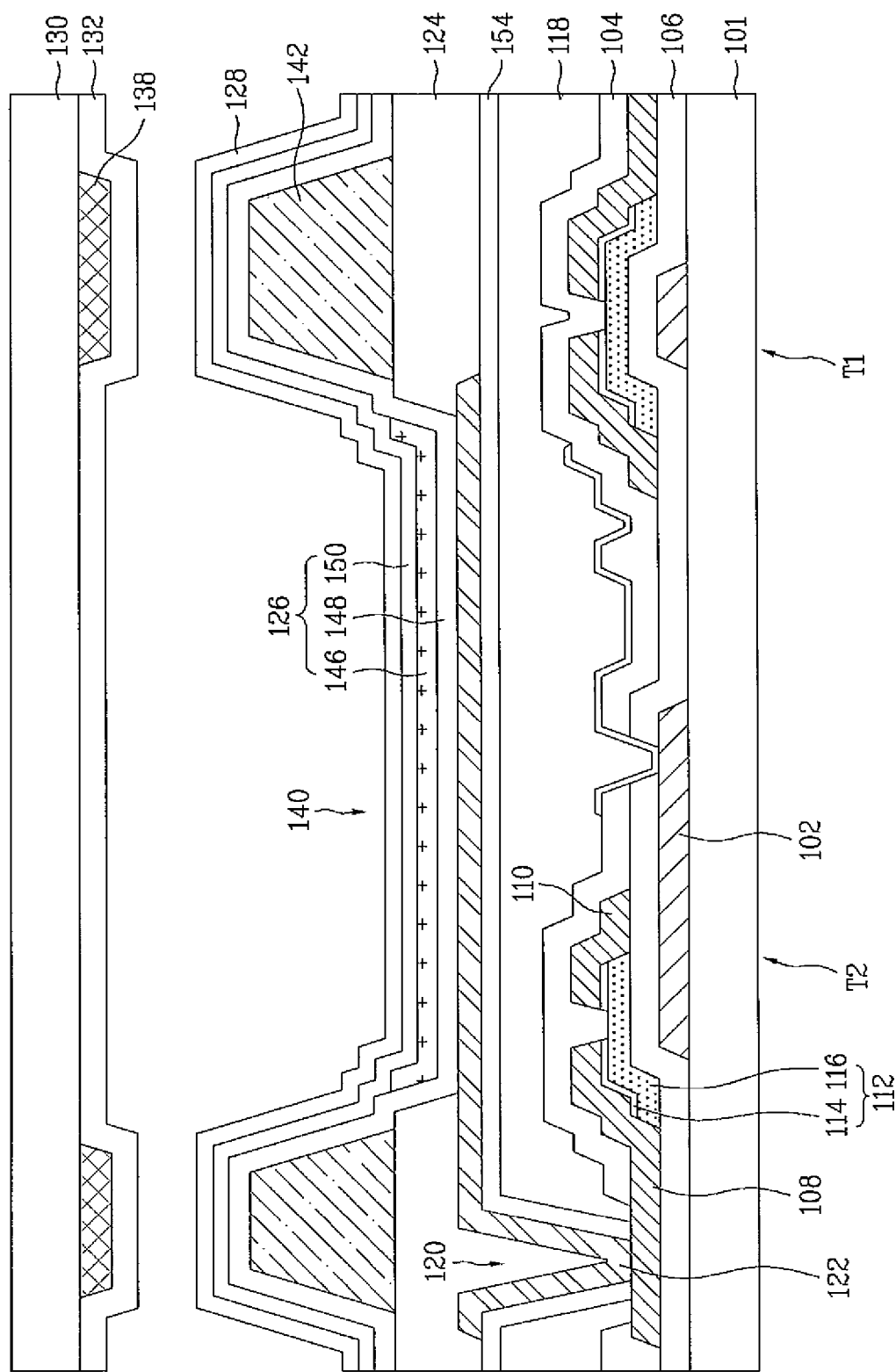
FIG. 16 is a sectional view briefly illustrating a luminescence display panel according to an eighth embodiment of the present invention.

FIG. 16 is a sectional view briefly illustrating a luminescence display panel according to an eighth embodiment of the present invention.

The luminescence display panel according to the eighth embodiment of the present invention is identical to that of the first embodiment, except that the luminescence display panel additionally includes a buffer layer 154 formed between the first electrode 122 and the organic passivation film 118, using the same organic insulating material as that of the inorganic passivation film 104, contact spacers 142, and bus electrodes 138. Accordingly, no description will be given of the same configuration.

As shown in FIG. 16, the contact spacers 142 are formed on the bank insulating film 124. The contact spacers 142 function to maintain a desired cell gap between the upper substrate 130 and the lower substrate 101, and thus to prevent formation of a step between the central and peripheral portions of the luminescence display panel. In a conventional luminescence display panel, in which a desired cell gap is maintained by sealants, the cell gap is gradually reduced as it extends from a peripheral portion of the panel, where the sealants are arranged, to a central portion of the panel. As a result, a step is formed between the central and peripheral portions of the panel. Due to such a step, the conventional luminescence display panel exhibits a degradation in picture quality such as a Newton's ring phenomenon that Newton's rings having wave patterns are exhibited at the central portion of the panel, except for the peripheral portion where the sealants are arranged. However, the present invention can avoid a degradation in picture quality such as the Newton's ring phenomenon because there is no step formed between the central and peripheral portions of the panel.

During the formation of a first organic associated layer 148, a luminescence layer 146, and a second organic associated layer 150, the contact spacers 142 come into contact with shadow masks respectively used to form the layers 146, 148, and 150. On the other hand, in the conventional luminescence display panel, which does not include contact spacers, shadow masks respectively used to form the first organic associated layer, luminescence layer, and second organic associated layer come into contact with the first electrode, first organic associated layer, and luminescence layer during the formation of the first organic associated layer, luminescence layer, and second organic associated layer. As a result, in the conventional luminescence display panel, scratches are formed on the first organic associated layer and luminescence layer, which are arranged in a luminescence area, due to the shadow masks. Thus, a degradation in picture quality may occur. In the luminescence display panel of the present invention, however, scratches are formed on the contact spacers 142, which are arranged in a non-luminescence area. Accordingly, there is no affect on picture quality caused by the scratches.

The second electrode 128 is connected to the auxiliary electrode 132 formed on the upper substrate 130 in regions where the contact spacers 142 are arranged. The auxiliary electrode 132 may have a single layer structure using a TCO material or may have a multilayer structure including at least one TCO material layer and at least one opaque metal layer having a thin film structure. The opaque metal layer included in the auxiliary electrode 132 has a thickness capable of allowing light to pass therethrough, namely, a thickness of about 10 to 500 Å. The bus electrodes 138 are formed on the auxiliary electrode 132 or on the upper substrate 130 such that they are overlapped with the contact spacers 142, respectively. The bus electrodes 138 are made of a metal having a high conductivity, to compensate for resistance components of at least one of the second electrode 128 and auxiliary electrode 132. As a result, the contact resistance between the auxiliary electrode 132 and the second electrode 128 is relatively lowered.

An organic layer, which includes the first organic associated layer 148, luminescence layer 146, and second organic associated layer 150, are formed between the first and second electrodes 122 and 128.

The first and second organic associated layers 148 and 150 are formed, using shadow masks, which expose the lower substrate 101, except for a peripheral portion of the lower substrate 101. Thus, the first and second organic associated layers 148 and 150 are formed over the entire upper surface of the lower substrate 101 formed with the contact spacers 142. Where the first electrode 122 is a cathode, and the second electrode 128 is an anode, the first organic associated layer 148 is formed as an electron-related layer for supplying electrons to the luminescence layer 146. In this case, the second organic associated layer 150 is formed as a hole-related layer for supplying holes to the luminescence layer 146. On the other hand, where the first electrode 122 is an anode, and the second electrode 128 is a cathode, the first organic associated layer 148 is formed as a hole-related layer for supplying holes to the luminescence layer 146. In this case, the second organic associated layer 150 is formed as an electron-related layer for supplying electrons to the luminescence layer 146.

The luminescence layer 146 is formed, using a shadow mask, which exposes the emission region of each pixel. Thus, the luminescence layer 146 is formed on the emission region of each pixel. The luminescence layer 146 emits light of a particular wavelength as exciters generated in accordance with re-coupling of electrons from the first and second organic associated layers 148 and 150 return to a ground state. The light is emitted toward the upper substrate 130 over the entire surface thereof.

Figure 17:
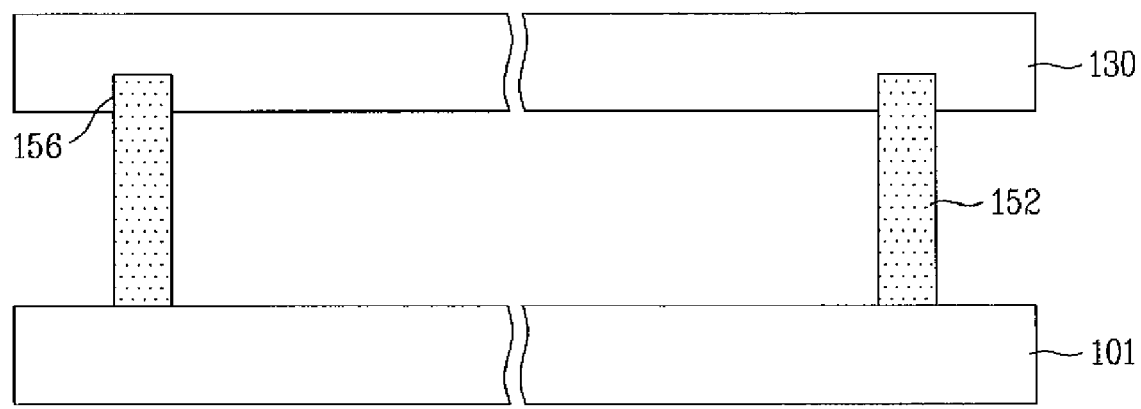
FIG. 17 is a sectional view illustrating sealants for assembling upper and lower substrates of the luminescence display panel according to any one of the first to eighth embodiment of the present invention.

Meanwhile, sealants 152 made of an epoxy material or a frit material are formed between the upper substrate 130 and the lower substrate 101, as shown in FIG. 17. Where each sealant 152 is made of the frit material, it is possible to protect the luminescence display panel without using a moisture getter because the sealant made of the frit material exhibits a high bonding force to the upper and lower substrates 130 and 101, as compared to the sealant made of the epoxy material.

The sealants 152 made of the frit material are coated on at least one of the upper and lower substrates 130 and 101, and then cured by heat or light. A laser is then irradiated to the cured frit sealants 152, which are, in turn, melted and subsequently solidified, thereby assembling the upper and lower substrates 130 and 101.

When the frit sealants 152 have a height larger than the height of the cell gap of the luminescence display panel, grooves 156 may be formed in at least one of the upper and lower substrates 130 and 101, as shown in FIG. 17, in order to equalize the heights of the frit sealants 152 and cell gap. Thus, the luminescence display panel according to the above-described embodiment of the present invention can prevent a degradation in picture quality such as a Newton's ring phenomenon that, in the conventional luminescence display panel, Newton's rings having wave patterns are exhibited at the central portion of the panel due to a step formed as the central portion of the panel is lower than the peripheral portion of the panel.

Meanwhile, the luminescence display panel fabricating methods according to the second to eighth embodiments of the present invention are identical to that of the first embodiment, except for the materials of the first and second electrodes, the material of the organic layer, and the structure of the organic layer.

As apparent from the above description, in accordance with the luminescence display panel and the fabricating method thereof according to the present invention, the second electrode formed on the organic layer is formed in the form of a thin film having a thickness capable of preventing the organic layer from being adversely influenced, using a thermal deposition method, a sputtering method, or a combination thereof. Accordingly, it is possible to prevent the organic layer from being damaged.

In accordance with the luminescence display panel and the fabricating method thereof according to the present invention, the auxiliary electrode, which is connected to the second electrode, is formed on the upper substrate. Accordingly, it is possible to perform a high-temperature process, without taking into consideration any damage to the organic layer. Since the high-temperature process is applicable, an enhancement in film characteristics is achieved.

In accordance with the luminescence display panel and the fabricating method thereof according to the present invention, the TFTs, first electrode, the organic layer, and the second electrode are formed on the lower substrate, and the R, G, and B color filters, the overcoat layer, and the auxiliary electrode are formed on the upper substrate. Subsequently, the upper and lower substrates are vacuum-assembled. In this state, the auxiliary electrode is in contact with the second electrode of the lower substrate.

In accordance with the luminescence display panel and the fabricating method thereof according to the present invention, R, G, and B colors can be displayed using the organic layer, which emits white light. Accordingly, an enhancement in color reproducibility is achieved. Further, an enhancement in aperture ratio is achieved in accordance with the full-surface light emission.

In accordance with the luminescence display panel and the fabricating method thereof according to the present invention, it is possible to prevent formation of a step between the central and peripheral portions of the panel by the contact spacers functioning to maintain a desired cell gap between the upper and lower substrates, and thus to prevent a degradation in picture quality such as a Newton's ring phenomenon. Since the contact spacers come into contact with shadow masks during the formation of the organic layers, it is also possible to minimize damage to the organic layers.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A luminescence display panel comprising:
    a first electrode formed on a lower substrate;
    a bank insulating film formed with an organic hole, through which the first electrode is partially exposed;
    an organic layer formed on the first electrode exposed through the organic hole, the organic layer including a luminescence layer;
    a second electrode formed on the organic layer, the second electrode having a thin film structure; and
    an auxiliary electrode formed on an entire surface of an upper substrate and facing the lower substrate, the auxiliary electrode being overlapped with the first electrode in a vertical direction,
    wherein the second electrode is thinner than at least one of the first electrode and the auxiliary electrode; and
    wherein the auxiliary electrode is connected to the second electrode at a region only where the second electrode is overlapped with the bank insulating film.

2. The luminescence display panel according to claim 1, wherein the auxiliary electrode and the second electrode are connected by assembling together the upper substrate with the auxiliary electrode and the lower substrate with the second electrode.

3. The luminescence display panel according to claim 1, wherein at least one of the first electrode, the second electrode, and the auxiliary electrode is formed to have a structure having at least one layer made of an opaque conductive material having a high reflectivity, or to have a structure having at least one layer made of a transparent conductive material, or to have a multilayer structure made of a combination of the opaque conductive material and the transparent conductive material.

4. The luminescence display panel according to claim 3, wherein the opaque conductive material has a thickness of 10 to 500 Å.

5. The luminescence display panel according to claim 3, wherein the opaque conductive material is selected from a group consisting of aluminum (Al), silver (Ag), copper (Cu), magnesium (Mg), and molybdenum (Mo).

6. The luminescence display panel according to claim 4, wherein the transparent conductive material is selected from a group consisting of an indium tin oxide (ITO) and an indium zinc oxide (IZO).

7. The luminescence display panel according to claim 1, further comprising:
    an upper passivation film formed between the upper substrate and the second electrode.

8. The luminescence display panel according to claim 1, wherein each of the auxiliary electrode and the second electrode has an embossing structure.

9. The luminescence display panel according to claim 1, further comprising:
    red, green, and blue color filters formed between the auxiliary electrode and the upper substrate, the red, green, and blue color filters receiving white light emitted from the organic layer, thereby rendering red, green and blue colors, respectively.

10. The luminescence display panel according to claim 9, further comprising:

an overcoat layer formed between the color filters and the auxiliary electrode, to planarize the surfaces of the color filters; and a bus electrode formed on a portion of the overcoat layer corresponding to a region where the second electrode and the auxiliary electrode are connected, using a conductive material.

11. The luminescence display panel according to claim 1, further comprising:

a bus electrode formed on the upper substrate or on the auxiliary electrode such that the bus electrode is connected to the auxiliary electrode.

12. The luminescence display panel according to claim 1, further comprising:

contact spacers formed between the upper substrate and the lower substrate, to maintain a desired cell gap between the upper substrate and the lower substrate, wherein the auxiliary electrode is in contact with the second electrode in a region where the contact spacers are arranged.

13. The luminescence display panel according to claim 1, further comprising:

sealants made of a frit material, to assemble the upper substrate and the lower substrate.

14. The luminescence display panel according to claim 13, wherein at least one of the upper and lower substrates is formed with grooves in regions respectively corresponding to the frit sealants.

* * * * *